(12) United States Patent
Stefanopoulou et al.

(10) Patent No.: US 10,074,996 B2
(45) Date of Patent: Sep. 11, 2018

(54) BULK FORCE IN A BATTERY PACK AND ITS APPLICATION TO STATE OF CHARGE ESTIMATION

(71) Applicants: Anna G. Stefanopoulou, Ann Arbor, MI (US); Shankar Narayan Mohan, Ann Arbor, MI (US); Youngki Kim, Ann Arbor, MI (US); Jason B. Siegel, Ann Arbor, MI (US)

(72) Inventors: Anna G. Stefanopoulou, Ann Arbor, MI (US); Shankar Narayan Mohan, Ann Arbor, MI (US); Youngki Kim, Ann Arbor, MI (US); Jason B. Siegel, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 154 days.

(21) Appl. No.: 14/839,096

(22) Filed: Aug. 28, 2015

(65) Prior Publication Data
US 2016/0064972 A1    Mar. 3, 2016

Related U.S. Application Data

(60) Provisional application No. 62/043,519, filed on Aug. 29, 2014.

(51) Int. Cl.
*H01M 10/44* (2006.01)
*H01M 10/46* (2006.01)
(Continued)

(52) U.S. Cl.
CPC ........ *H02J 7/0021* (2013.01); *G01R 31/3634* (2013.01); *G01R 31/3655* (2013.01); *Y02T 10/7055* (2013.01)

(58) Field of Classification Search
CPC ........ H02J 7/0013; H02J 7/1423; H02J 7/355; H02J 7/0042; H02J 2007/005; H02J 7/009; H02J 7/0091
(Continued)

(56) References Cited

U.S. PATENT DOCUMENTS 5,670,861 A    9/1997 Nor
6,016,047 A    1/2000 Notten et al.
(Continued)

FOREIGN PATENT DOCUMENTS

| JP | 2006012761 A | 1/2006 |
|---|---|---|
| JP | 2010-40324 | 2/2010 |
| WO | 2012170873 A9 | 12/2012 |

OTHER PUBLICATIONS

Barai, et al., Stochastic Analysis of Diffusion Induced Damage in Lithium-Ion Battery Electrodes, Journal of the Electrochemical Society, 2013, 160(6):A955-A967.
(Continued)

*Primary Examiner* — Edward Tso
(74) *Attorney, Agent, or Firm* — Quarles & Brady LLP

(57) ABSTRACT

There is disclosed an electrical device including a battery pack, a pressure sensor for measuring a volume change of the battery pack, a voltage sensor in electrical communication with a positive terminal and a negative terminal of the battery pack, a temperature sensor positioned in a cell of the battery pack, and a battery management system. The battery management system includes a controller in electrical communication with the pressure sensor, the voltage sensor, and the temperature sensor, the controller being configured to execute a program stored in the controller to determine a state of charge percentage of the battery pack based on a
(Continued)

pressure reading from the pressure sensor, a terminal voltage reading from the voltage sensor, and a temperature reading from the temperature sensor.

26 Claims, 15 Drawing Sheets

(51) Int. Cl.
*H02J 7/00* (2006.01)
*G01R 31/36* (2006.01)

(58) Field of Classification Search
USPC ............... 320/107, 112, 132, 147, 149, 150, 320/DIG. 21; 324/426, 427, 430, 433
See application file for complete search history.

(56) References Cited

U.S. PATENT DOCUMENTS

| | | | |
|---|---|---|---|
| 6,359,419 | B1 | 3/2002 | Verbrugge et al. |
| 8,859,123 | B2 | 10/2014 | Christensen et al. |
| 9,203,122 | B2 | 12/2015 | Raghavan et al. |
| 2006/0097698 | A1 | 5/2006 | Plett |
| 2009/0001992 | A1 | 1/2009 | Tsuchiya |
| 2009/0210179 | A1 | 8/2009 | Tang et al. |
| 2009/0326842 | A1 | 12/2009 | Thomas-Alyea |
| 2012/0189879 | A1 | 7/2012 | Fetzer et al. |
| 2012/0203483 | A1 | 8/2012 | Ghantous et al. |
| 2012/0290234 | A1 | 11/2012 | Schaefer |
| 2012/0293121 | A1 | 11/2012 | Horii |
| 2013/0041538 | A1 | 2/2013 | Jin et al. |
| 2013/0295424 | A1 | 11/2013 | Knoedgen et al. |
| 2013/0323554 | A1 | 12/2013 | Heubner et al. |
| 2014/0139230 | A1 | 5/2014 | Unterrieder et al. |
| 2014/0234730 | A1 | 8/2014 | Albertus et al. |
| 2015/0214757 | A1* | 7/2015 | Zane ................ H02J 7/0021 320/107 |

OTHER PUBLICATIONS

Chang, The State of Charge Estimating Methods for Battery: A Review, ISRN Applied Mathematics, vol. 2013, Article ID 953792, 7 pages.
Cheng, et al., Evolution of Stress Within a Spherical Insertion Electrode Particle Under Potentiostatic and Galvanostatic Operation, Journal of Power Sources, 2009, 190(2):453-460.
Christensen, Jake, Modeling Diffusion-Induced Stress in Li-Ion Cells with Porous Electrodes, Journal of the Electrochemical Society, 2010, 157(3):A366-A380.
Christensen, John, et al., Stress Generation and Fracture in Lithium Insertion Materials, Journal of Solid State Electrochemistry, 2006, 10(5):293-319.
Fu, et al., Modeling, Validation and Analysis of Mechanical Stress Generation and Dimension Changes of a Pouch Type High Power Li-Ion Battery, Journal of Power Sources, 2013, 224:211-224.
Garrick, et al., Modeling Volume Change Due to Intercalation Into Porous Electrodes, Journal of the Electrochemical Society, 2014, 161(8):E3297-E3301.
He, et al., Adaptive State of Charge Estimation for Li-Ion Batteries Based on an Unscented Kalman Filter with an Enhanced Battery Model, Energies, 2013, 6:4134-4151.
Huria, et al., State of Charge Estimation of High Power Lithium Ion Phosphate Cells, Journal of Power Sources, 2014, 249:92-102.
Kim, et al., Maximum Power Estimation of Lithium-Ion Batteries Accounting for Thermal and Electrical Constraints, Proceedings of the ASME 2013 Dynamic Systems and Control Conference, Document No. DSCC2013-3935, 8 pages.
Kim, et al., Optimal Power Management for a Series Hybrid Electric Vehicle Cognizant of Battery Mechanical Effects, 2014 American Control Conference, pp. 3832-3837.
Moraal, et al., Observer Design for Nonlinear Systems with Discrete-Time Measurements, IEEE Transactions on Automatic Control, 1995, 40(3):395-404.
Oh, et al., Rate Dependence of Swelling in Lithium-Ion Cells, Journal of Power Sources, 2014, 267:197-202.
Peabody, et al., The Role of Mechanically Induced Separator Creep in Lithium-Ion Battery Capacity Fade, Journal of Power Sources, 2011, 196:8147-8153.
Plett, Extended Kalman Filtering for Battery Management Systems of LiPB-Based HEV Battery Packs—Part 3. State and Parameter Estimation, Journal of Power Sources, 2004, 134:277-292.
Pop, et al., State-of-Charge Indication in Portable Applications, IEEE ISIE, 2005, pp. 1007-1012.
Qi, et al., In Situ Observation of Strains During Lithiation of a Graphite Electrode, Journal of the Electrochemical Society, 2010, 157(6):A741-A747.
Samad, et al., Parameterization and Validation of a Distributed Coupled Electro-Thermal Model for Prismatic Cells, ASME 2014 Dynamic Systems and Control Conference, vol. 2, Paper No. DSCC2014-6321, pp. 1-9.
Sepasi, et al., A Novel On-Board State-of-Charge Estimation Method for Aged Li-Ion Batteries Based on Model Adaptive Extended Kalman Filter, Journal of Power Sources, 2014, 245:337-344.
Sethuraman, et al., Real-Time Stress Measurements in Lithium-Ion Battery Negative-Electrodes, Journal of Power Sources, 2012, 206:334-342.
Shi, et al., Modeling Stresses in the Separator of a Pouch Lithium-Ion Cell, Journal of Power Sources, 2011, 196 (19):8129-8139.
Siegel, et al., Expansion of Lithium Ion Pouch Cell Batteries: Observations from Neutron Imaging, Journal of the Electrochemical Society, 2013, 160(8):A1031-A1038.
Song, et al., Diffusion Induced Stresses in Cylindrical Lithium-Ion Batteries: Analytical Solutions and Design Insights, Journal of the Electrochemical Society, 2012, 159(12):A2060-A2068.
Truchot, et al., State-of-Charge Estimation and Uncertainty for Lithium-Ion Battery Strings, Applied Energy, 2014, 119:218-227.
Winter, et al., Dilatometric Investigations of Graphite Electrodes in Nonaqueous Lithium Battery Electrolytes, Journal Df the Electrochemical Society, 2000, 147(7):2427-2431.
Woodford, et al., Design Criteria for Electrochemical Shock Resistant Battery Electrodes, Energy & Environmental Science, 2012, 5:8014-8024.
Xiao, et al., A Multi-Scale Approach for the Stress Analysis of Polymeric Separators in a Lithium-Ion Battery, Journal of Power Sources, 2010, 195(22):7649-7660.
Yazami, et al., Thermodynamics and Crystal Structure Anomalies in Lithium-Intercalated Graphite, Journal of Power Sources, 2006, 153(2):312-318.
Zhang, et al., Dissecting Anode Swelling in Commercial Lithium-Ion Batteries, Journal of Power Sources, 2012, 218:52-55.
PCT International Search Report and Written Opinion, PCT/US2015/047458, dated Jan. 22, 2016, 23 pages.
Machine translation of Japanese Patent Application No. 2010-40324.

* cited by examiner

US 10,074,996 B2

BULK FORCE IN A BATTERY PACK AND ITS APPLICATION TO STATE OF CHARGE ESTIMATION

CROSS-REFERENCES TO RELATED APPLICATIONS

This application claims priority from U.S. Patent Application No. 62/043,519 filed Aug. 29, 2014.

STATEMENT REGARDING FEDERALLY SPONSORED RESEARCH

This invention was made with government support under number DE-AR0000269 awarded by the U.S. Department of Energy. The government has certain rights in the invention.

BACKGROUND OF THE INVENTION

1. Field of the Invention

This invention relates to an electrical device including a battery pack and a battery management system that determines a state of charge percentage of the battery pack based, at least in part, on a pressure reading from a pressure sensor adjacent the battery pack, a terminal voltage reading from the battery pack, and a temperature reading from the battery pack. More particularly, the invention relates to bulk forces exerted by a lithium on cell during various operating conditions and their effects on state of charge.

2. Description of the Related Art

Vehicles are used to facilitate modern transportation. Different energy sources (e.g., hydrocarbon fuel, battery systems, capacitance systems, compressed air systems) can be used to generate the power needed to facilitate movement of the vehicle. Electric vehicles, also referred to as all-electric vehicles, include a battery system and utilize electric power for the entirety of their motive power. A plug in power source is needed for electric vehicles for charging.

Hybrid vehicles and plug-in hybrid electric vehicles include both an internal combustion engine and a battery system. The battery is capable of being charged from a plug-in power source. Additionally, the internal combustion engine can turn a generator, that supplies a current to an electric motor to move the vehicle.

Knowing the amount of energy that is left in the battery gives the vehicle operator an idea of how long the vehicle can be used before recharging must take place, State of Charge (SOC) is an estimation used to compare the current state of the battery to the battery at full charge. The preferred SOC reference should be the current capacity of the cell, as the cell capacity is reduced by age, temperature, and discharge effects.

In all-electric vehicles, the SOC is used to determine the distance a vehicle can travel. SOC should be an absolute value based on current capacity of the battery to reduce error when the battery ages. When the SOC has fallen to a threshold, the driver of the vehicle must recharge the vehicle, much like refilling the fuel tank in a car. In hybrid electric vehicles, SOC determines when the engine is to be switched on and off. When SOC has fallen to a threshold, the engine is turned on and provides power to the vehicle.

Knowledge of the SOC is particularly important for large lithium batteries, Lithium batteries are significantly reactive and need electronic battery management systems to keep the battery within a safe operating window. Lithium on batteries expand as they are charged and contract as they are discharged. These changes in volume and length are caused by the absorption and release processes of lithium ions in the active materials of the electrodes. The absorption of the lithium into the carbon material causes the material to expand. An understanding of the SOC allows for control of the volumetric change of the battery, decreasing premature wear or ageing processes in lithium-ion batteries.

Lithium intercalation and de-intercalation result in the volumetric changes in both electrodes of a lithium-ion battery cell. At the anode, carbon particles can swell by as much as 12% during lithium intercalation, and the resulting stress can be large [Ref. 1], Commercial battery packs involve numerous cells assembled to occupy a fixed space as shown in FIG. 1 and held in mild compression to resist changes in volume associated with lithium intercalation and de-intercalation. A small compression prevents de-lamination and associated deterioration of electronic conductivity of the electrodes. A large compression, however, can decrease the separator thickness and lead to degradation and power reduction due to the separator pore closing [Ref. 2].

The effect of expansion and the system's mechanical response on the cell performance and life [Refs. 2, 3, 4, 5] are under intense investigation with studies ranging from the micro-scale [Refs. 6, 1, 5], the particle level [Ref. 6], and multiple electrode layers [Refs. 7, 8]. While progress towards predicting the multi-scale phenomena is accelerating [Refs. 9, 10], the full prediction of a cell expansion and its implications to cell performance depends heavily on the boundary conditions associated with the cell construction and electrode tabbing and crimping. Moreover, the wide range of conditions with respect to C-rates and temperatures that automotive battery cells must operate make the physics-based modeling approach very challenging. (The C-rate specifies the speed a battery is charged or discharged. For example, at 1 C, the battery charges and discharges at a current that is par with the marked amp-hour (Ah) rating. At 0.5 C, the current is one half and the time is doubled, and at 2 C the current is two-times and the time is one half.) Finally, measuring and quantifying the internal stress or strain to tune or validate the multi-scale models requires complex instrumentation [Refs. 11, 12]. In contrast to the micro-scale, the macro-scale stress and strain responses are directly observable and measured with high accuracy [Refs. 13, 14, 15], thus could be used to develop phenomenological models inspired by the underlying physics.

A phenomenological model that mimics the evolution of bulk force/stress and that quantifies the contributions of state of charge dependent intercalation and thermal effects would be desirable. The model could then be used for regulating the power drawn to avoid damaging forces and stresses on the cell [Ref. 16]. Such a methodology would enable a power management scheme that is conscious of mechanical limits similarly to the electric (voltage) and thermal limits as in Ref. 17.

Thus, what is needed is an electrical device including a battery management system that more preciously determines a state of charge percentage of the battery pack, particularly for lithium ion batteries.

SUMMARY OF THE INVENTION

In one aspect, the invention provides an electrical device including a battery pack, a pressure sensor for measuring a volume change of the battery pack, a voltage sensor in electrical communication with a positive terminal and a negative terminal of the battery pack, a temperature sensor positioned in a cell of the battery pack, and a battery management system. The battery management system includes a controller in electrical communication with the pressure sensor, the voltage sensor, and the temperature sensor. The controller is configured to execute a program stored in the controller to determine a state of charge percentage of the battery pack based on a pressure reading from the pressure sensor, a terminal voltage reading from the voltage sensor, and a temperature reading from the temperature sensor.

In another aspect, the invention provides an electrical device including a battery pack; a temperature sensor positioned in a cell of the battery pack; and a battery management system including a controller in electrical communication with the temperature sensor. The controller is configured to execute a program stored in the controller to determine a state of charge percentage of the battery pack based on a temperature reading from the temperature sensor.

In another aspect, the invention provides a method for determining a state of charge percentage of a battery pack. By sensing a volume change of the battery pack, a terminal voltage of the battery pack, and a temperature in a cell of the battery pack, the state of charge percentage of the battery pack can be determined.

In another aspect, the invention provides a method for determining a state of charge percentage of a battery pack. By sensing a current of the battery pack and sensing a temperature in a cell of the battery pack, the state of charge percentage of the battery pack can be determined.

In another aspect, the invention provides a method for determining a state of charge percentage of a battery pack. The method comprises determining the state of charge percentage of the battery pack based on some subset of steps (a)-(f) as follows: (a) sensing at least one current of the battery pack; (b) sensing at least one temperature in at least one cell of the battery pack; (c) sensing at least one volume change of the battery pack; (d) sensing at least one terminal voltage of a cell in the battery pack; (e) estimating at least one temperature in at least one cell of the battery pack; and (f) sensing a temperature of the ambient medium.

It is shown herein how to utilize bulk force measurements to improve the quality of state of charge estimates for lithium-ion cells. State of charge estimates are influenced by operating conditions and are dependent on the electrode chemistry of the cell. Measurement of the force induced in a fixture that constrains cell expansion due to SOC changes provides for more accurate SOC estimates. Force also depends on the expansion due to thermal swelling of the cell material. It is shown how to discount the temperature dependence in SOC estimation.

The methods described herein do not require spatially distributed sensors or sensors placed inside the cell enclosure, but rather uses bulk measurements to determine a state of charge estimate. Additionally, the impact of temperature dynamics and the nonlinearity of measured force as a function of state of charge are explicitly incorporated. Measured force/pressure is used to complement battery terminal voltage measurements when determining state of charge. Finally, the impact of current magnitude and direction is factored into the proposed model.

Thus, in this disclosure, the feasibility of using a model developed for State of Charge (SOC) estimation is highlighted.

These and other features, aspects, and advantages of the present invention will become better understood upon consideration of the following detailed description, drawings and appended claims.

DETAILED DESCRIPTION OF THE INVENTION

Figure 1:
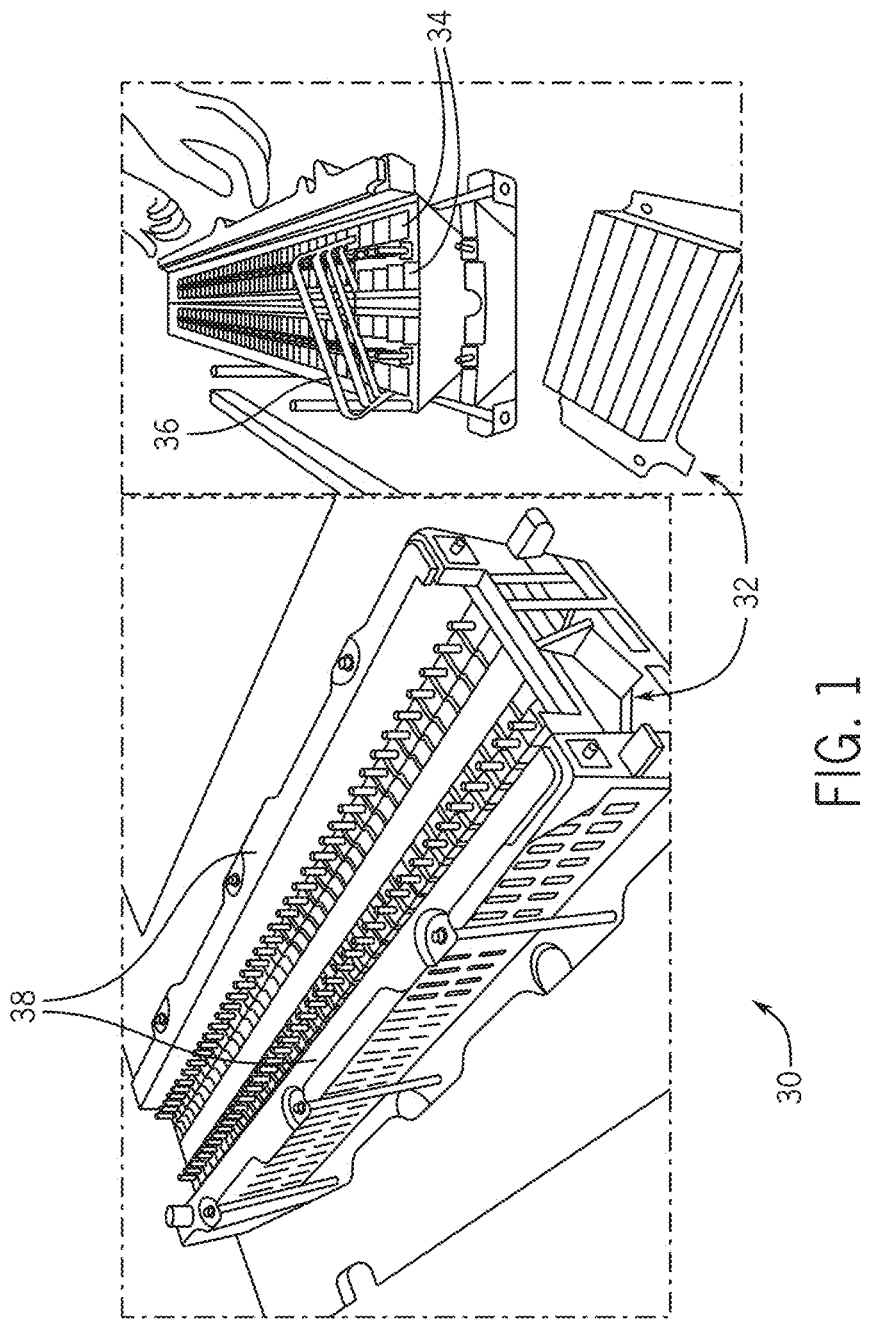
FIG. 1 shows a drawing of battery cells under compression in a Ford Fusion Hybrid Electric Vehicle (HEV) battery pack (left), and the disassembled array after the compression bars have been removed (right).

An electrical device of the invention including a battery pack and a battery management system has many uses. In one non-limiting example, the electrical device including a battery pack and a battery management system is used in electric vehicles. Hybrid electric vehicles use both high voltage battery power for traction, and an internal combustion engine for propulsion and for battery charging via a generator. Plug-in electric vehicles can be charged from an external source of electricity, and the stored energy is used to power the vehicle. Battery management systems for electric vehicles may include an electronic controller to monitor various parameters associated with the operation of the battery pack. For example, temperature, pressure, current, voltage, capacity, and so forth can be monitored by the controller of the battery management system.

It is also possible for the battery management system to predict other parameters, such as state of charge, based on the parameters monitored by the system. The battery management system can calculate these parameters, such as state of charge, through the use of a controller. Parameters such as temperature, pressure, current, voltage, capacity and so forth are used as variables in a programmed algorithm run by a processor of the controller, which in turn produces a state of charge estimate. The battery state of charge (SOC) gives the ratio of the amount of energy presently stored in the battery to the nominal rated capacity expressed as a percentage or a number in the range [0,1]. For example, for a battery with a 500 Ah capacity and having an energy stored in the battery of 400 Ah, the SOC is 80% or 0.8. However, SOC could be expressed as a unit, such as 400 Ah for a battery with a 500 Ah capacity and having an energy stored in the battery of 400 Ah.

In one example embodiment, the invention provides an electrical device including a battery pack, a pressure sensor for measuring a volume change of the battery pack, a voltage sensor in electrical communication with a positive terminal and a negative terminal of the battery pack, a temperature sensor positioned in a cell of the battery pack, and a battery management system. The battery management system includes a controller in electrical communication with the pressure sensor, the voltage sensor, and the temperature sensor. The controller receives electrical signals representative of pressure, voltage, and temperature from the pressure sensor, the voltage sensor, and the temperature sensor. The controller is configured to execute a program stored in the controller to determine a state of charge percentage of the battery pack based, at least in part, on a pressure reading from the pressure sensor, a terminal voltage reading from the voltage sensor, and a temperature reading from the temperature sensor.

In one version of the device, the device further comprises a current sensor wired to measure a current flowing from the pack, and the controller executes the program stored in the controller to determine the state of charge percentage of the battery pack based on the current flowing from the pack.

In one version of the device, the device further comprises a temperature sensor positioned to measure ambient temperature, and the controller executes the program stored in the controller to determine the state of charge percentage of the battery pack based on the ambient temperature.

In one version of the device, the pressure sensor is selected from (i) a sensor that measures stress, pressure, or force; (ii) a sensor that measures strain, or displacement, or (iii) a sensor that measures any form of physical deformation. The physical deformation may be measured using a hydraulic or mechanical or piezoelectric or optical device.

In one version of the device, the controller executes the program stored in the controller to determine the state of charge percentage of the battery pack based on a charging current and a discharging current from the cell.

In another version of the device, the controller executes the program stored in the controller to determine the state of charge percentage of the battery pack based on a charge/discharge hysteresis state of the cell.

In another version of the device, the controller executes the program stored in the controller to determine the state of charge percentage of the battery pack based on a capacity of the cell.

In another version of the device, the controller executes the program stored in the controller to determine the state of charge percentage of the battery pack based on an ambient temperature of the battery pack.

In another version of the device, the controller executes the program stored in the controller to determine the state of charge percentage of the battery pack based on a temperature in a cell of the battery pack.

In another version of the device, the controller executes the program stored in the controller to determine the state of charge percentage of the battery pack based on an internal resistance of a cell of the battery pack.

In another version of the device, the controller executes the program stored in the controller to determine the state of charge percentage of the battery pack based on an open circuit voltage of a cell of the battery pack.

In another version of the device, the controller executes the program stored in the controller to determine the state of charge percentage of the battery pack wherein the controller is programmed to choose one program from a plurality of programs stored in the controller to determine the state of charge percentage of the battery pack. The controller may choose the one program based, at least in part, on a present estimate of the state of charge percentage of the battery pack. The controller may choose the one program based, at least in part, on a present estimate of the temperature in a cell in the battery pack. The controller may choose the one program based, at least in part, on a present estimate of temperatures of a plurality of cells in the battery pack. The controller may choose the one program based, at least in part, on a measurement of the temperature of the battery pack wherein the measurement of temperature of the battery pack is by way of a plurality of temperature sensors. The controller may choose the one program based, at least in part, on measurements of the temperature of plurality of cells in the battery pack.

In one version of the device, the battery pack is a lithium ion battery pack. The battery pack may include a plurality of prismatic cells. Each prismatic cell may comprise a positive electrode selected from lithium nickel manganese cobalt oxide, lithium manganese oxide, and lithium iron phosphate, a negative electrode selected from graphite, lithium titanate, hard carbon, tin/cobalt alloy, and silicon carbon, and an electrolyte selected from lithium salts such as $LiPF_6$, $LiBF_4$, and $LiClO_4$.

In another version of the device, the battery pack comprises a first plate and an opposed second plate. An inner side of the first plate is in contact with a first end of the plurality of cells of the battery pack, and an inner side of the second plate is in contact with a second end of the plurality of cells of the battery pack. One or more adjustable connectors can be used to keep the first plate and the second plate in contact with the plurality of cells of the battery pack. In the electrical device, the pressure sensor can be a load cell on one of the battery plates. The load cell senses volume change of the plurality of cells of the battery pack which are between the first plate and the second plate. In one version of the device, the load cell is adjacent an outer side of the first plate. The load cell provides electrical signals to the battery management system.

In the electrical device, the temperature sensor may comprise a plurality of temperature sensors, and/or the voltage sensor may comprise a plurality of voltage sensors, and/or the pressure sensor may comprise a plurality of pressure sensors, and/or the current sensor, and/or a plurality of current sensors.

In another example embodiment, the invention provides an electrical device comprising a battery pack; a temperature sensor positioned in a cell of the battery pack; and a battery management system including a controller in electrical communication with the temperature sensor. The controller is configured to execute a program stored in the controller to determine a state of charge percentage of the battery pack based on a temperature reading from the temperature sensor.

In one version of the device, the device further comprises a current sensor wired to measure a current flowing from the pack, and the controller executes the program stored in the controller to determine the state of charge percentage of the battery pack based on the current flowing from the pack.

In one version of the device, the device further comprises a temperature sensor positioned to measure ambient temperature, and the controller executes the program stored in the controller to determine the state of charge percentage of the battery pack based on the ambient temperature.

In one version of the device, the device further comprises a pressure sensor for measuring a volume change of the battery pack, and the controller executes the program stored in the controller to determine the state of charge percentage of the battery pack based on a pressure reading from the pressure sensor. The pressure sensor may be selected from: (i) a sensor that measures stress, pressure, or force; or (ii) a sensor that measures strain, or displacement, or (iii) a sensor that measures any form of physical deformation. The physical deformation may be measured using a hydraulic or mechanical or piezoelectric or optical device.

In another version of the device, the controller executes the program stored in the controller to determine the state of charge percentage of the battery pack based on a charging current and a discharging current from the cell.

In another version of the device, the controller executes the program stored in the controller to determine the state of charge percentage of the battery pack based on a charge/discharge hysteresis state of the cell.

In another version of the device, the controller executes the program stored in the controller to determine the state of charge percentage of the battery pack based on a capacity of the cell.

In another version of the device, the controller executes the program stored in the controller to determine the state of charge percentage of the battery pack based on an ambient temperature of the battery pack.

In another version of the device, the controller executes the program stored in the controller to determine the state of charge percentage of the battery pack based on a temperature in a cell of the battery pack.

In another version of the device, the controller executes the program stored in the controller to determine the state of charge percentage of the battery pack based on an internal resistance of a cell of the battery pack.

In another version of the device, the controller executes the program stored in the controller to determine the state of charge percentage of the battery pack based on an open circuit voltage of a cell of the battery pack.

In another version of the device, the controller executes the program stored in the controller to determine the state of charge percentage of the battery pack wherein the controller is programmed to choose one program from a plurality of programs stored in the controller to determine the state of charge percentage of the battery pack. The controller may choose the one program based, at least in part, on a present estimate of the state of charge percentage of the battery pack. The controller may choose the one program based, at least in part, on a present estimate of the temperature in a cell in the battery pack. The controller may choose the one program based, at least in part, on a present estimate of temperatures of a plurality of cells in the battery pack. The controller may choose the one program based, at least in part, on a measurement of the temperature of the battery pack wherein the measurement of temperature of the battery pack is by way of a plurality of temperature sensors. The controller may choose the one program based, at least in part, on measurements of the temperature of plurality of cells in the battery pack.

In one version of the device, the battery pack is a lithium ion battery pack. The battery pack may include a plurality of prismatic cells. Each prismatic cell may comprise a positive electrode selected from lithium nickel manganese cobalt oxide, lithium manganese oxide, and lithium iron phosphate, a negative electrode selected from graphite, lithium titanate, hard carbon, tin/cobalt alloy, and silicon carbon, and an electrolyte selected from lithium salts such as $LiPF_6$, $LiBF_4$, and $LiClO_4$.

In another version of the device, the battery pack comprises a first plate and an opposed second plate. An inner side of the first plate is in contact with a first end of the plurality of cells of the battery pack, and an inner side of the second plate is in contact with a second end of the plurality of cells of the battery pack. One or more adjustable connectors can be used to keep the first plate and the second plate in contact with the plurality of cells of the battery pack. In the electrical device, the pressure sensor can be a load cell on one of the battery plates. The load cell senses volume change of the plurality of cells of the battery pack which are between the first plate and the second plate. In one version of the device, the load cell is adjacent an outer side of the first plate. The load cell provides electrical signals to the battery management system.

In the electrical device, the temperature sensor may comprise a plurality of temperature sensors, and/or the voltage sensor may comprise a plurality of voltage sensors, and/or the pressure sensor may comprise a plurality of pressure sensors, and/or the current sensor, and/or a plurality of current sensors.

In another aspect, the invention provides a vehicle that includes any of the electrical devices as previously described, the vehicle being configured to supply electrical power to propel the vehicle. The vehicle may include an internal combustion engine, a generator, and a fuel tank storing fuel. The internal combustion engine is designed to combust the fuel from the fuel tank to power the generator, and the generator is configured to supply electrical power to the battery pack to recharge the battery pack. The generator may supply electrical power to the battery pack when the battery pack is in certain state of charge (SOC) ranges, such as 30% to 50% SOC, or 30% to 70% SOC.

In another aspect, the invention provides a consumer electronics apparatus which includes any of the electrical devices as previously described.

In another aspect, the invention provides a satellite system which includes any of the electrical devices as previously described.

In another aspect, the invention provides a mechanized apparatus which includes any of the electrical devices as previously described.

In another aspect, the invention provides a spacecraft system which includes any of the electrical devices as previously described.

In another example embodiment, the invention provides a method for determining a state of charge percentage of a battery pack. By sensing a volume change of the battery pack, a terminal voltage of the battery pack, and a temperature in at least one cell of the battery pack, the state of charge percentage of the battery pack can be determined such as in a processor.

In one version, the method comprises sensing a current of the battery pack, wherein the method comprises determining the state of charge percentage of the battery pack based, at least in part, on the current of the battery pack.

In one version, the method comprises sensing an ambient temperature of the battery pack, wherein the method comprises determining the state of charge percentage of the battery pack based, at least in part, on the ambient temperature of the battery pack.

In one version, the method comprises determining the state of charge percentage of the battery pack based, at least in part, on a plurality of terminal voltage sensors.

In one version, the method comprises determining the state of charge percentage of the battery pack based, at least in part, on a plurality of battery temperature sensors.

In one version, the method comprises determining the state of charge percentage of the battery pack based, at least in part, on a plurality of ambient temperature sensors.

In one version, the method comprises determining the state of charge percentage of the battery pack based, at least in part, on a plurality of current sensors.

In one version, the method comprises determining the state of charge percentage of the battery pack based, at least in part, on a charging current and a discharging current from the cell.

In one version, the method comprises determining the state of charge percentage of the battery pack based, at least in part, on a charge/discharge hysteresis state of the cell.

In one version, the method comprises determining the state of charge percentage of the battery pack based, at least in part, on a capacity of the cell.

In one version, the method comprises determining the state of charge percentage of the battery pack based, at least in part, on an ambient temperature of the battery pack.

In one version, the method comprises determining the state of charge percentage of the battery pack based, at least in part, on an internal resistance of a cell of the battery pack.

In one version, the method comprises determining the state of charge percentage of the battery pack based, at least in part, on an open circuit voltage of a cell of the battery pack.

In one version, the method comprises determining the state of charge percentage of the battery pack based, at least in part, on a temperature in a cell of the battery pack.

In another example embodiment, the invention provides a method for determining a state of charge percentage of a battery pack, wherein the method comprises (a) sensing a current of the battery pack; (b) sensing a temperature in a cell of the battery pack; and (c) determining the state of charge percentage of the battery pack based, at least in part, on the current and the temperature in the cell of the battery pack.

In one version, the method comprises sensing a volume change of the battery pack, wherein the method comprises determining the state of charge percentage of the battery pack based, at least in part, on the volume change of the battery pack.

In one version, the method comprises sensing an ambient temperature of the battery pack, wherein the method comprises determining the state of charge percentage of the battery pack based, at least in part, on the ambient temperature of the battery pack.

In one version, the method comprises determining the state of charge percentage of the battery pack based, at least in part, on a plurality of terminal voltage sensors.

In one version, the method comprises determining the state of charge percentage of the battery pack based, at least in part, on a plurality of battery temperature sensors.

In one version, the method comprises determining the state of charge percentage of the battery pack based, at least in part, on a plurality of ambient temperature sensors.

In one version, the method comprises determining the state of charge percentage of the battery pack based, at least in part, on a plurality of current sensors.

In one version, the method comprises determining the state of charge percentage of the battery pack based, at least in part, on a charging current and a discharging current from the cell.

In one version, the method comprises determining the state of charge percentage of the battery pack based, at least in part, on a charge/discharge hysteresis state of the cell.

In one version, the method comprises determining the state of charge percentage of the battery pack based, at least in part, on a capacity of the cell.

In one version, the method comprises determining the state of charge percentage of the battery pack based, at least in part, on an ambient temperature of the battery pack.

In one version, the method comprises determining the state of charge percentage of the battery pack based, at least in part, on an internal resistance of a cell of the battery pack.

In one version, the method comprises determining the state of charge percentage of the battery pack based, at least in part, on an open circuit voltage of a cell of the battery pack.

In another example embodiment, the invention provides a method for determining the state of charge percentage of a battery pack. The method comprises determining the state of charge percentage of the battery pack based on some subset of steps (a)-(f) as follows: (a) sensing at least one current of the battery pack; (b) sensing at least one temperature in at least one cell of the battery pack; (c) sensing at least one volume change of the battery pack; (d) sensing at least one terminal voltage of a cell in the battery pack; (e) estimating at least one temperature in at least one cell of the battery pack; and (f) sensing a temperature of the ambient medium.

In one version, the method comprises determining the subset of steps (a)-(f) based, at least in part, on a present estimate of the state of charge of the battery pack.

In one version, the method comprises determining the subset of steps (a)-(f) based, at least in part, on a present temperature of a cell in the battery pack.

In one version, the method comprises determining the subset of steps (a)-(f) based, at least in part, on a present estimate of the temperature of a cell in the battery pack.

In one version, the method comprises determining the subset of steps (a)-(f) based, at least in part, on a present temperature of an ambient medium.

By a "subset of steps (a)-(f)", we mean a two or more steps of the set of steps (a)-(f).

EXAMPLES

The following Examples are provided in order to demonstrate and further illustrate certain embodiments and aspects of the present invention and are not to be construed as limiting the scope of the invention.

Example 1

Figure 3:
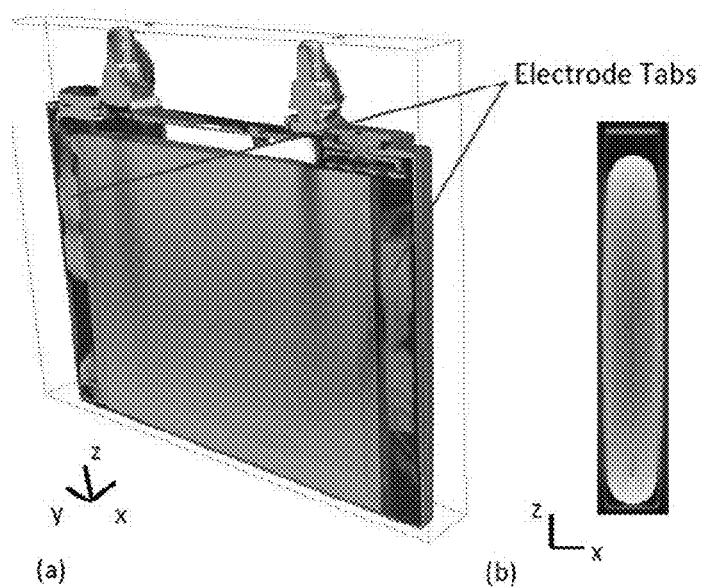
FIG. 3 shows X-ray tomographic slices of a battery showing the internal structure.

Prismatic Lithium-Nickel-Manganese-Cobalt-Oxide (NMC) batteries encased in a hard aluminum shell were used in this study. Each cell has a nominal capacity of 5 Ah and has outside dimensions of 120×85×12.7 mm. Inside the aluminum case is a horizontal flat-wound jelly roll that has dimensions 90×77.5×11.7 mm. In this orientation, with the tabs facing upwards as shown in FIG. 3, the bulk of the electrode expansion materializes as linear outward displacement of the sides of the aluminum case under unconstrained and free swelling [Ref. 13]. The packaging of the jelly roll makes the electrode expand primarily perpendicular to the largest face of the battery due to the wound structure and gaps between the electrode and casing around the top and bottom. This observed cell expansion is, consequently, exerted against the end-plates 32 when the battery pack 30 is assembled as shown in FIG. 1. The space between the batteries 34 is maintained via a plastic spacer 36 with dimples to preserve the airflow channels and still provide a means for compressing the batteries 34 which are located between compression bars 38.

Figure 2:
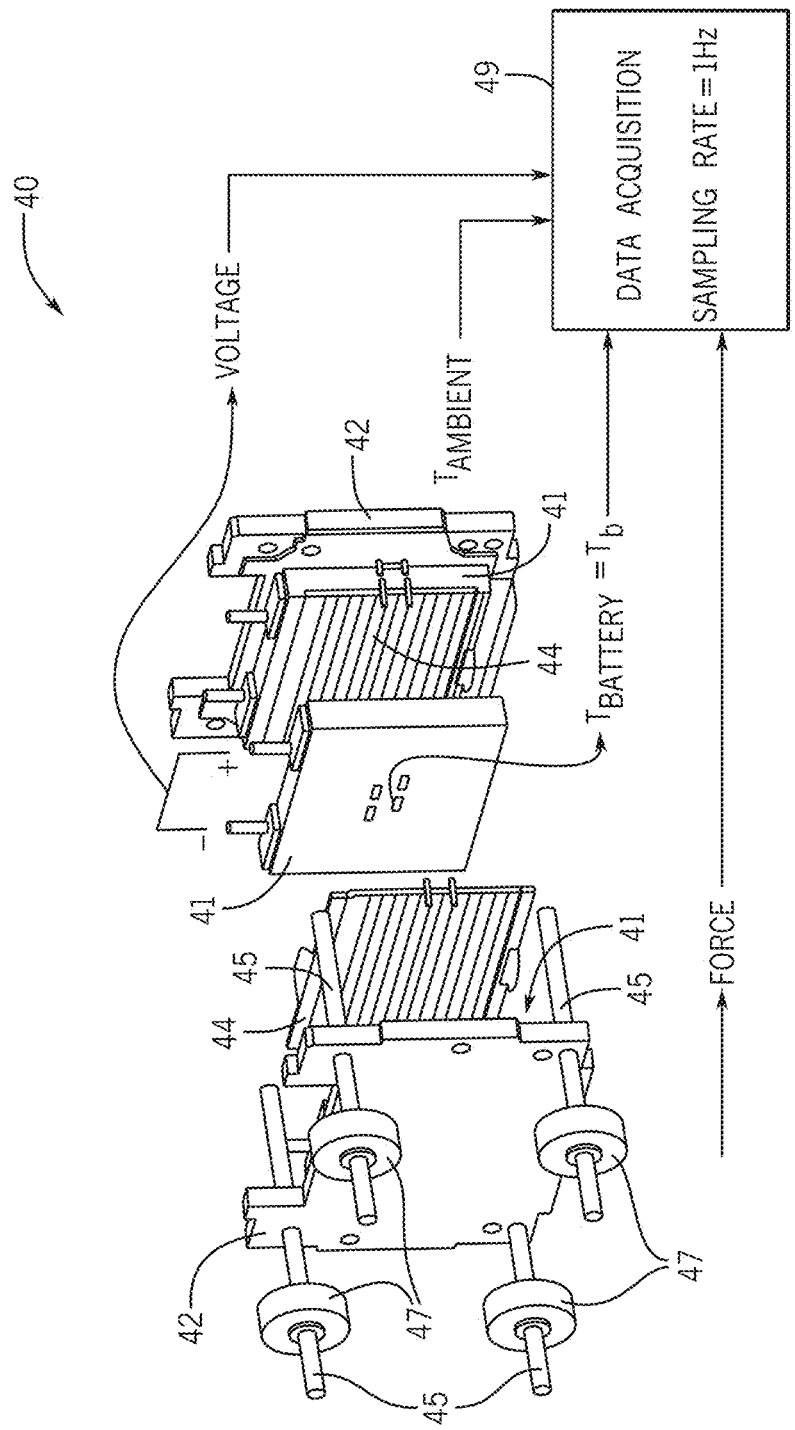
FIG. 2 is a schematic showing an exploded perspective view of a fixture used in the invention.

To allow for study of the force dynamics in a battery pack, a fixture 40 shown in FIG. 2 was designed and used in the following experiments. Three nickel-manganese-cobalt (NMC) batteries 41 connected in series were placed between two 1-inch thick Garolite (a fiberglass-epoxy composite) plates 42. The Garolite plates 42 allow for parallel placement and compression of the batteries 41 within the fixture 40 with spacers 44 between adjacent batteries 41, and the plates 42 are bolted together using four bolts 45, one in each corner of the plate 42. Each of the four bolts 45 is instrumented with a 350 ohm strain gauge (Omega LC8150-250-100 sensor) load cell 47, with a 450 Newton full scale range and 2 Newton accuracy. The fixture 40 was placed in an environmental chamber (Cincinnati Sub-Zero ZPHS16-3.5-SCT/AC) to control the ambient temperature. Current excitation is provided by means of a Bitrode model FTV, and the resulting force and temperature data is acquired via a National Instruments NI SCXI-1520 strain gauge input module and 18-bit data acquisition card. The battery temperature ($T_{battery}=T_b$), ambient temperature ($T_{ambient}=T_{amb}$), current, voltage, and force are sampled at a 1 Hz rate as shown at block 49 in FIG. 2.

Model Development

The volume change due to intercalation in the electrodes and thermal expansion has been related to the linear surface displacement of an unconstrained prismatic cell in Ref. 13. Analogous to the observations in Ref. 13, experimentally it has been observed in Ref. 16 that the bulk force in Li-ion cells is also affected by SOC and temperature. This example introduces a phenomenological model that captures the relation between bulk force, SOC and temperature in the three-cell fixture described above. In addition, experiments designed to characterize the model are described and the parameterization procedure is detailed. Since force and stress are proportional, in the remainder of this example, the bulk force is modeled.

Steady State Bulk Force Model

The basic static model describing the dependence of the steady state bulk force, f, on temperature and SOC is inspired by a non-linear spring model $$f = k_1 d + k_2 d^3 \tag{1}$$

where $k_1$ and $k_2$ are spring constants and d is a displacement. A third order relationship is chosen to capture the change in modulus. The displacement d consists of three terms: $d = d_0 + d_{Li} + d_T$. The variable $d_0$ represents change in displacement, compression, due to initial loading, whereas $d_{Li}$ and $d_T$ correspond to change in displacement driven by intercalation and temperature respectively.

By manipulating and lumping the contribution of $d_0$ and $d_{Li}$ to bulk force and assuming linear thermal expansion (i.e. $d_T \propto T$), $f(\cdot)$ is expressed as follows $$f(z, \Delta T) = \sum_{i=1}^{3} \sum_{j=0}^{i} \theta_{\frac{i+1}{2}+j} \bar{f}^{(i-j)}(z)(\Delta T)^j = \sum_{i=1}^{9} \theta_i \phi_i \tag{2}$$

where z represents battery SOC. We consider 25° C. to be the reference temperature and hereafter the difference between ambient temperature and reference temperature, $\Delta T$, is used in place of ambient temperature. The coefficient $\theta_1$ is constrained to equal one, where $\bar{f}(z)$ is the steady state force at ambient temperature of 25° C. and θ's denote parameters.

Figure 4:
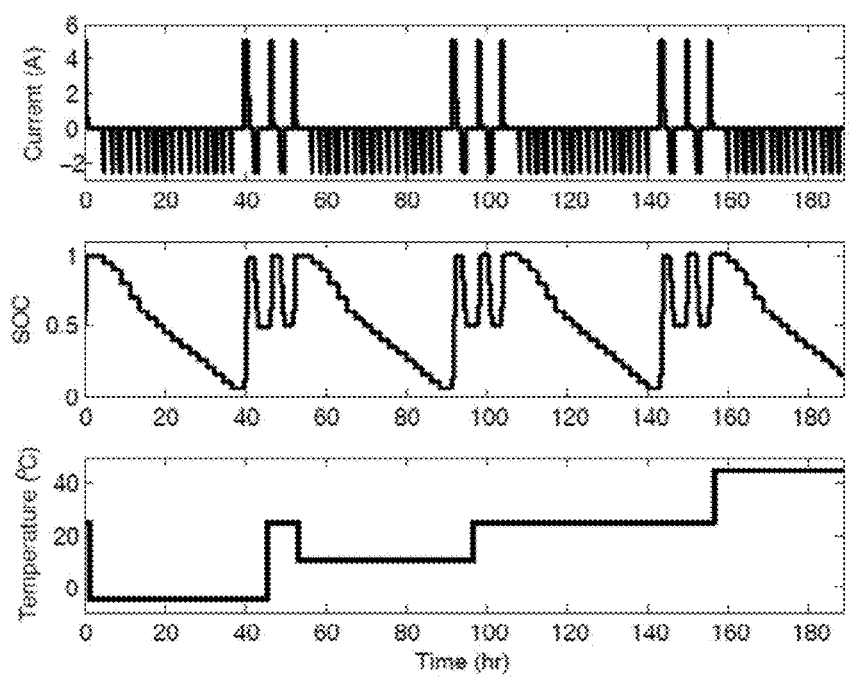
FIG. 4 is a graph showing test profiles of current, SOC, and temperature for parameterization of bulk force response.

Experiment: To parameterize the above model, the SOC and temperature of the cell described above are changed using a designed test profile as shown in FIG. 4. At every temperature $\in \{-5, 10, 25, 45\}$° C., the sequence of steps followed is listed below.

(S1): The cell is first charged using a constant current, 1C-rate (5 Amps) constant voltage (4.2V) charging profile until the current reached C/20 (0.25 Amps) at a fixed ambient temperature of 25° C. as regulated by the thermal chamber. 1C is the maximum magnitude of current that completely charges/discharges a cell in one hour uniformly in initial SOC. Follow charge by a three hour rest.

(S2): Pulse discharge using 0.5C current pulse to reduce the SOC and rest for two hours.

(S3): Repeat (S2) until SOC reaches five percent.

(S4): Rest for two hours.

(S5): Charge to 100% using 1C current and rest for three hours.

(S6): Discharge at 0.5C-rate until SOC reaches 50% and rest for two hours.

(S7): Set ambient temperature to 25° C.

(S8): Charge to 100% using 1C current and rest for three hours.

(S9): Discharge to 50% SOC using 0.5C current.

(S10): Rest for two hours and repeat (S1) at a new temperature.

Note that in the designed experiment, each change in temperature and step change is followed by a relaxation period to allow for equilibration of terminal voltage, cell temperature and force measurements. Steps (S8) and (S9) are performed to reduce any ambient temperature dependent stress accumulation. In addition, to reduce the impact of any path dependence of measured force on the trajectory of temperature and SOC, changes to the ambient temperature are made only when the cell is at 50% SOC and 25° C.

Model Parameterization and Reduction: Using data collected from the above experiment at the end of the relaxation following each SOC changing pulse, a least squares regression is used to find the parameters of the model in Equation (2). By performing sensitivity/correlation studies on the identified parameters, the most relevant regressors are identified and the final form of the static relation among the steady state force, the SOC (z), and temperature difference from the reference temperature ($\Delta T = T_{amb} - 25$° C.) is arrived at as shown on Equation (3).

$$f(z, \Delta T) = \bar{f}(z)(1 + \bar{f}(z)\theta_4 + \Delta T^2 \theta_8) + (\Delta T)^3 \theta_9 \tag{3}$$

Function $\bar{f}(z)$ is tabulated as a function of SOC (refer to Table 1). Parameters θ's are listed in Table 2.

TABLE 1

Measured steady state force at vas various SOCs and at reference temperature 25° C.

| Parameter | Value | | | | | | | |
|---|---|---|---|---|---|---|---|---|
| SOC | 0.05 | 0.10 | 0.15 | 0.20 | 0.30 | 0.35 | 0.40 | 0.45 |
| Force (N) | 167 | 177 | 190 | 208 | 226 | 247 | 267 | 291 |

| Parameter | Value | | | | | | | |
|---|---|---|---|---|---|---|---|---|
| SOC | 0.50 | 0.55 | 0.60 | 0.70 | 0.80 | 0.90 | 0.95 | 1.00 |
| Force (N) | 315 | 335 | 342 | 346 | 354 | 366 | 390 | 408 |

TABLE 2

Parameters of nonlinear static model

| Parameter | Value |
|---|---|
| $\theta_2$ | $5.58 \times 10^{-1}$ |
| $\theta_4$ | $-2.49 \times 10^{-4}$ |
| $\theta_8$ | $1.04 \times 10^{-3}$ |
| $\theta_9$ | $8.60 \times 10^{-3}$ |

Figure 5:
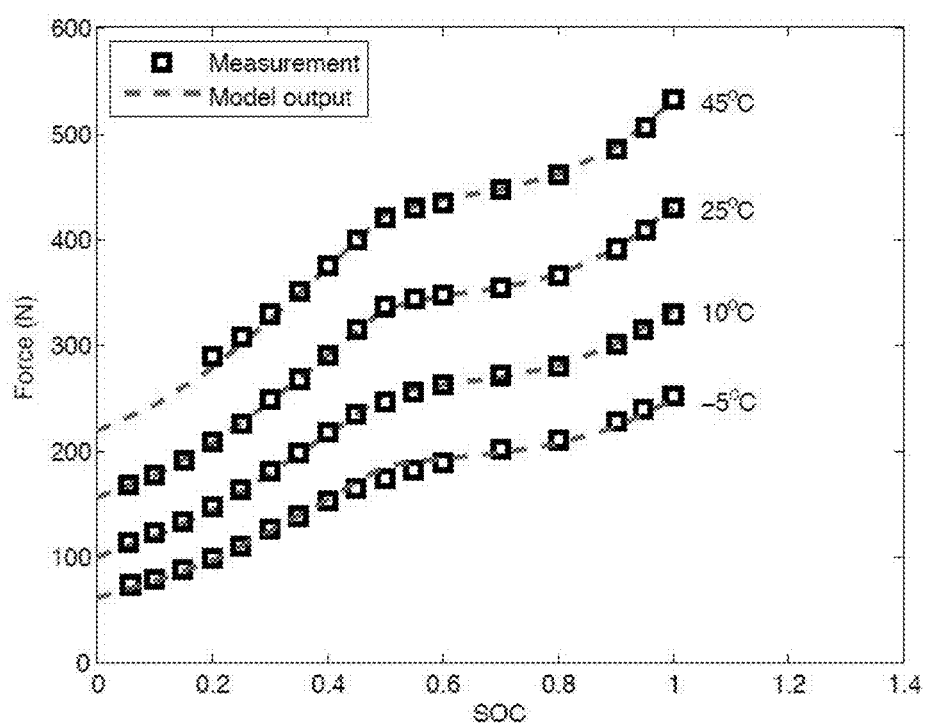
FIG. 5 is a graph showing the measured force at various states of charge and temperature compared with predicted bulk force at steady state.

FIG. 5 compares the measured steady state force to model output. It is observed that the chosen model structure as parameterized is able to reasonably predict the steady state force at different SOCs and ambient temperatures. It should be noted that the volumetric changes in the positive and negative electrodes cannot be distinguished from the measured force signal since the only bulk change is measured. However, the volumetric change of the positive electrode material, Lithium-Nickel-Manganese-Cobalt-Oxide (NMC), is much lower than that of the negative electrode material, graphite as summarized in Table 3. Therefore, it is reasonable to assume that this measured force is attributed to swelling in the negative electrode. It is also found that the overall shape of the measured force is similar to the calculated interlayer spacing of the negative electrode reported in Ref. 18.

TABLE 3

Volumetric strain change of various compounds [19]

| Electrode | Compound | Value [%] |
|---|---|---|
| Positive | $LiCoO_2$ | +1.9 |
| | $LiNiO_2$ | -2.8 |
| | $LiMn_2O_4$ | -7.3 |
| | $LiNi_{1/3}Mn_{1/3}Co_{1/3}O_2$* | +2.44 |
| Negative | Graphite $C_6$ | +12.8 |

*is the most similar to the positive electrode material in this study

Bulk Force Under Thermal Transients

Force is measured by load sensors instrumented in the corners of the end plate. Particularly, the rods and bolts that hold the fixture together, made of steel, have higher conductivity and their temperature dynamics is faster than that of the cell. Thus, the measured force during thermal transients is influenced by the thermal expansion of the fixture and that of the cell and hence the battery temperature needs to be considered along with the ambient temperature in the proposed model.

Figure 6:
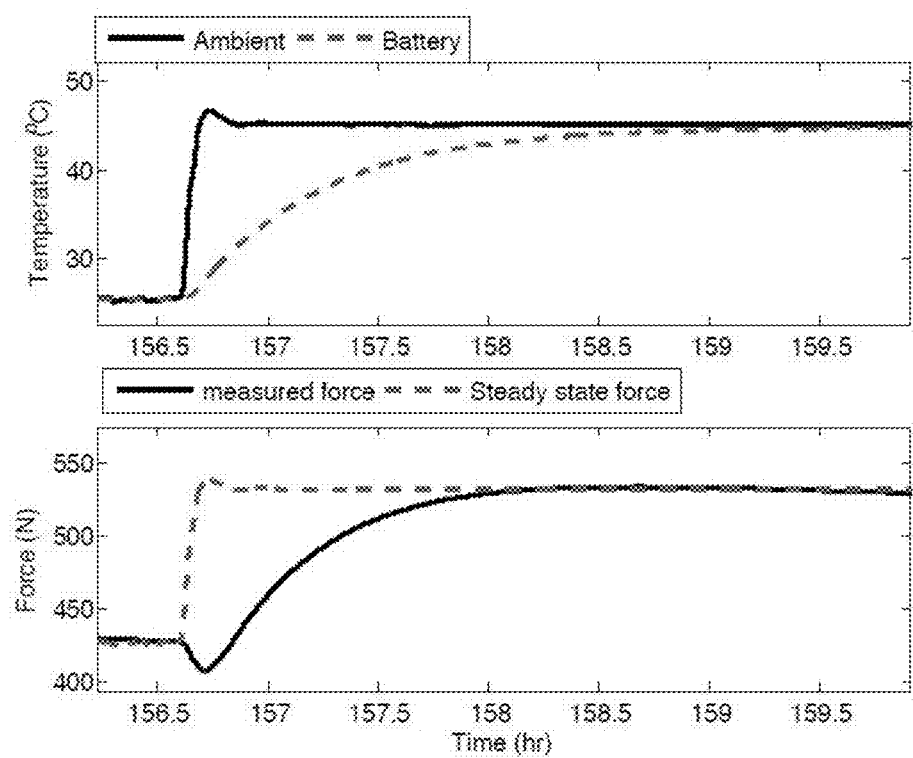
FIG. 6 is a graph of measured bulk force and that predicted by the static model $f(z,\Delta T)$.

FIG. 6 presents a comparison between the measured bulk force and that predicted by the static model, f (z,ΔT), described in the previous subsection for a step change in ambient temperature. Two interesting responses are observed. First, unlike the predicted force that follows the fast change in ambient temperature, the measured force in the fixture gradually changes as the battery temperature increases. Second, the measured force exhibits decreases before the gradual increase. This observation can be reasoned as follows. The temperature of the bolts increases rapidly following the step change in ambient temperature, and hence the bolts expand, releasing the pressure applied to the cell. Over such a short period of time, the battery temperature does not increase significantly to change the volume of the cell. Therefore, the recorded bulk force decreases.

Figure 7:
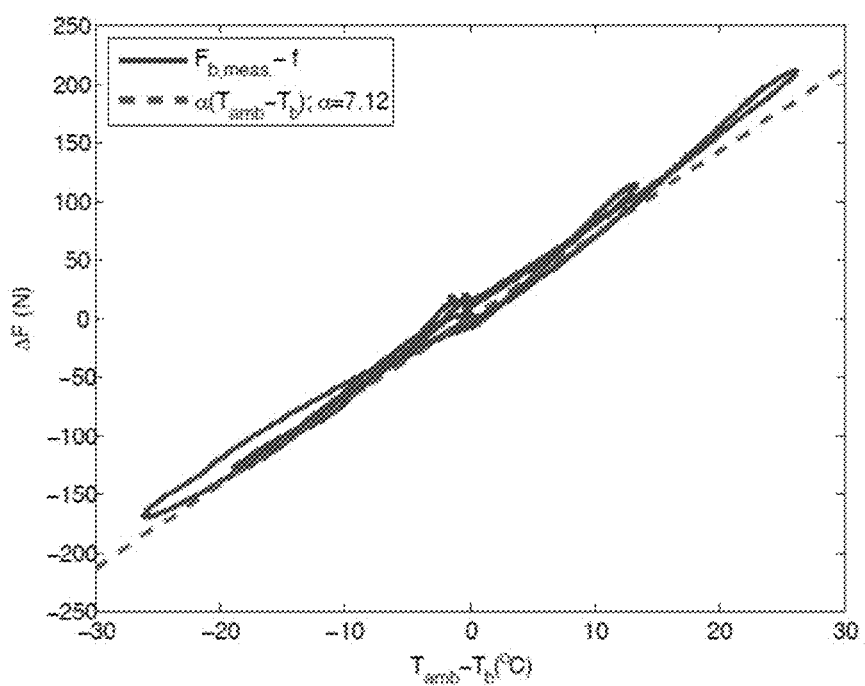
FIG. 7 is a graph of changes in bulk force during thermal transients.

Since the thermal dynamics of the fixture (the rods and bolts) is much faster than that of the cell, we assume that the fixture and the ambient are at the same temperature. To model the relation between the difference in temperature between ambient and the cell, and the resulting measured force, the two quantities are plotted against each other in FIG. 7. Clearly, there appears to be a linear relation between the quantities. The change in force due to temperature mismatch is captured by the following simple linear relation:

$$g(T_{amb}, T_b) = k_T(T_b - T_{amb}) \qquad (4)$$

where $k_T$ is found to be 7.12 N/K. Combining Equations. (3) and (4), the static relation between SOC, temperature (cell and ambient) and force is expressed as $$F_s(z, T_b, T_{amb}) = f(z, T_{amb}) + g(T_{amb}, T_b) \qquad (5)$$

Figure 8:
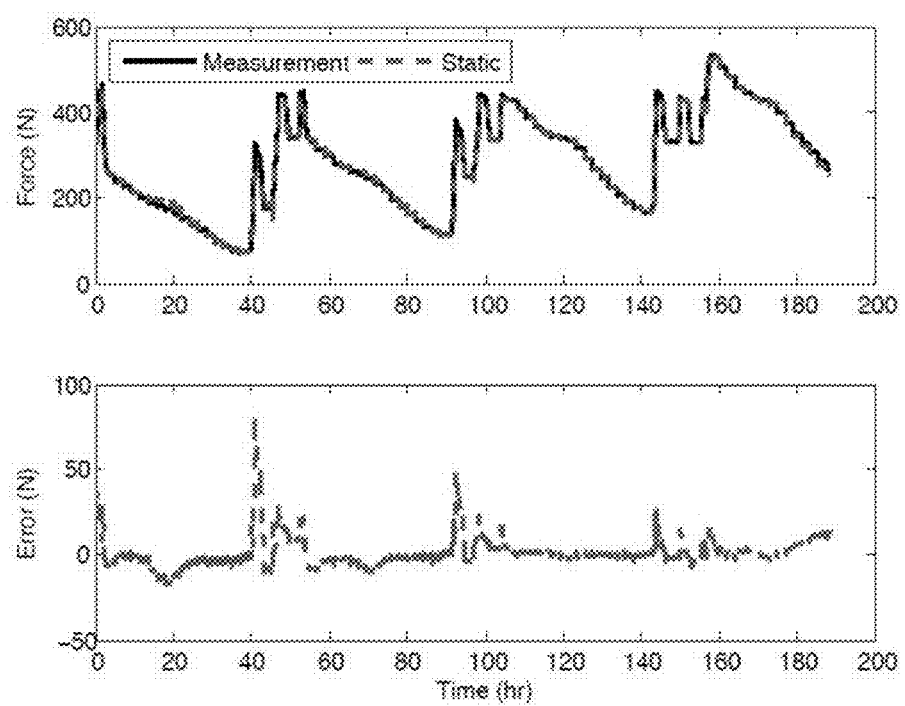
FIG. 8 is a graph of measured and modeled forces for the input profile shown in FIG. 4.

Results comparing the measurement and prediction are shown in FIG. 8. The overall shape of the cell response and the model output is the same; however, the modeled force shows large errors during charging and relaxation periods. In the next subsection, a dynamic model is proposed to better capture this transient behavior of force in the form of a hysteresis model.

Force Hysteresis During Charge/Discharge

Figure 9:
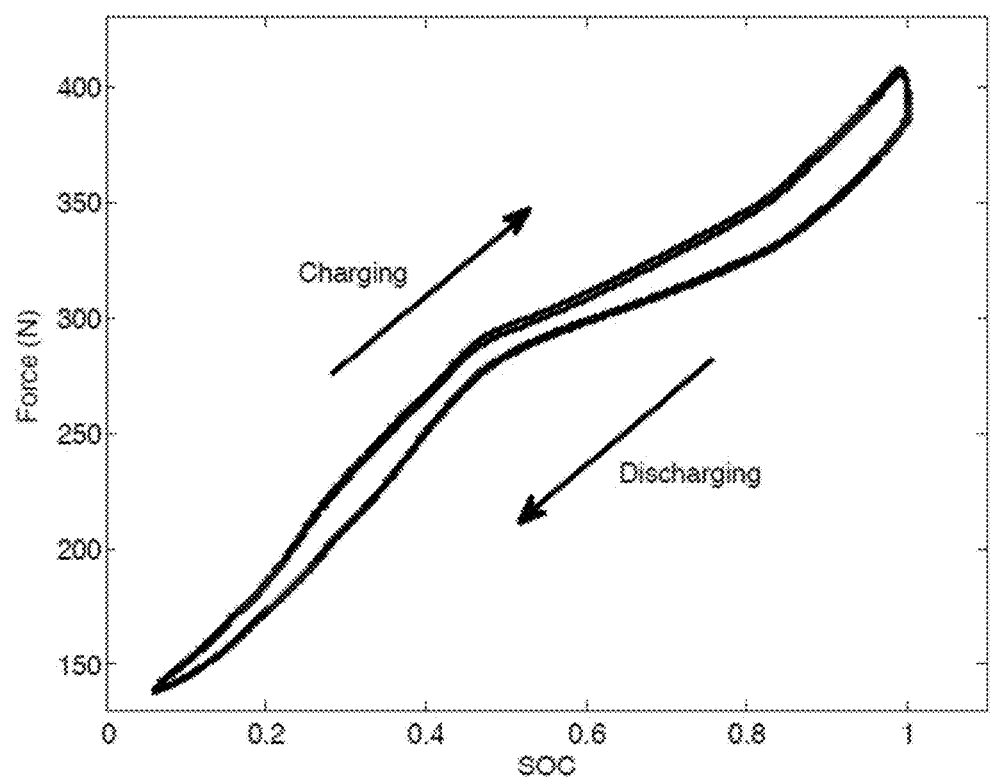
FIG. 9 is a graph of measured bulk force when the cell is cycled using a 1 C current with the ambient temperature of 25° C.

In the previous sections, a static model accounting for the influence of temperature (both ambient and fixture) and intercalation on the measured bulk force was modeled; the static relation for intercalation dependent stress was developed using measurements obtained while the pack was continuously discharged. In Ref. 20, the authors experimentally note that a hysteresis in measured stress between charging and discharging, and a similar characteristic is observed in our experiments. FIG. 9 presents measurements of bulk force when the cell is cycled using a 1C current at the ambient temperature of 25° C. The measured force as a function of SOC is different during charge and discharge. This hysteresis in the force measurement is a classic viscoelastic response of polymer materials under strain cycling.

Hysteresis is a common phenomenon observed in measurements from Li-ion cells—Plett [Ref. 21] notes a hysteresis in measured open circuit potential of LiFePO$_4$ cells; however, its presence in measurements is chemistry dependent. Based on the first order hysteresis model proposed by Plett in Ref. 21, we model the dynamics of the force hysteresis state as follows $$\dot{h} = \alpha\zeta I(R(z) - h) + \beta(\zeta + (1-\zeta)\gamma)h \quad (6)$$

$$\zeta := \begin{cases} 1, & I \geq 0 \\ 0, & I < 0 \end{cases}$$

where I is the battery current; h is the state; $\alpha$, $\beta$, $\gamma$ are tunable parameters. Note that the model in Equation (6) is different from that described in Ref. 21 in that the hysteretic model is inherently stable. The SOC dependent function R(z) is representative of envelope of the hysteretic term using the measured discharge curve as a reference—this choice is motivated by the observation that during discharge, regardless of the path taken, the measured force does not undergo significant dynamics. It is possible that the R(·) is a function of the magnitude of the input excitation although this dependence has not been fully observed with the current experiment and needs more investigation as future work. An alternative argument could possibly be made in favor of using the discharge curve as reference by noting that the deintercalation diffusion constants are faster and hence the transients associated with diffusion are also faster. In line with observation, the term $\gamma$>1 is used to accelerate the dynamics of the h to ensure that the worst-case error in predicting force is not much larger than the difference of the discharge curve from the true hysteretic basis curve.

To train the model, parameters of the hysteresis model, $\nu=[\alpha,\beta,\gamma]'$, are identified by minimizing the Euclidean norm of the difference between measurement and model prediction, the resulting parameters are $\nu^+$. That is, we solve the following optimization problem $$\vartheta^* = \arg\min_\vartheta \sum_{i=1}^{N_f} \|\bar{F} - (\bar{F}_s(z_i, (T_b)_i, (T_{amb})_i) + h_i)\|^2$$

subject to: $h_{i+1} = (1 + t_s\beta(\zeta(1-\gamma) + \gamma))h_i + t_s\alpha\zeta IR(z_i)$ $h_0 = 0$ where $N_f$ is the number of measurement points, $t_s$ is the duration of the sampling period and $z_i$ is the state of charge at the $i^{th}$ data point. This operation was performed on data collected over the interval spanned by steps (S8) and (S9) in the experiment described above with the ambient temperature set to 25° C. The minimization problem is solved by using Sequential Quadratic Programming (SQP)[22] in MATLAB and the identified parameters are provided in Table 4.

Figure 10:
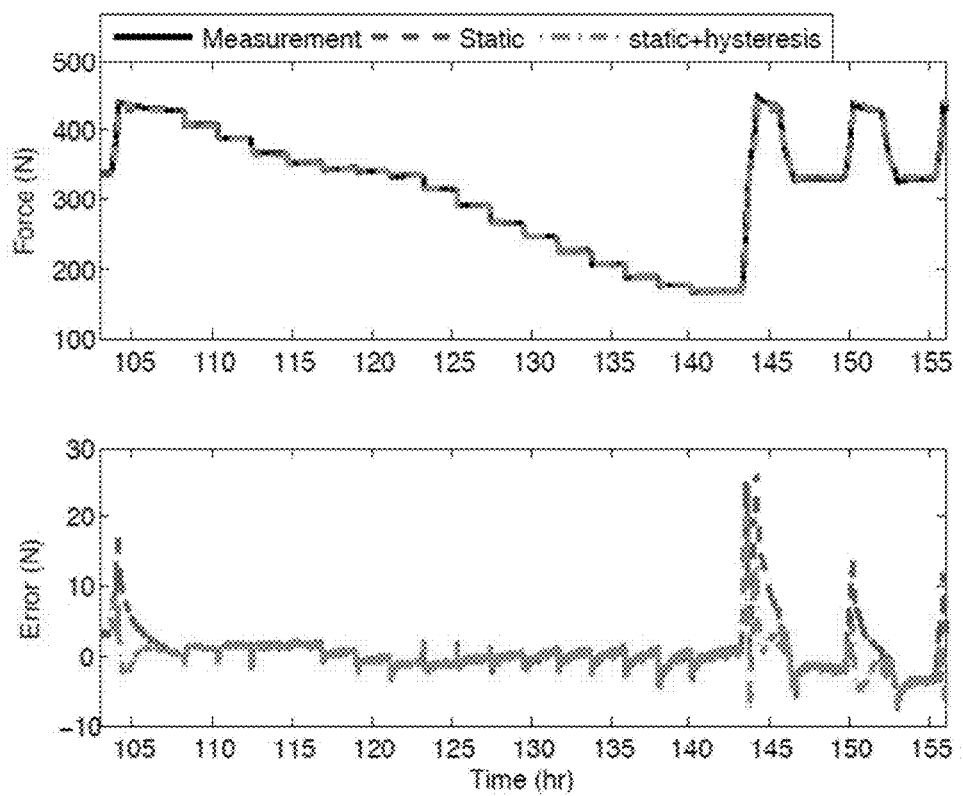
FIG. 10 is a graph of the per-bolt force predictions using the complete model at an ambient temperature of 25° C.

Predictions of the combined static and hysteresis models over the entire data-set corresponding to an ambient temperature of 25° C. are compared to measurements in FIG. 10. As evidenced by the second subplot, the inclusion of the hysteresis model, on an average, helps reduce the error across the entire trajectory.

Model Validation

The complete bulk force model, F, is summarized for convenience below.

$$\dot{z} = \frac{I}{Q \cdot 3600} \quad (7)$$

$$\dot{h} = \alpha\zeta I(R(z) - h) + \beta(\zeta + 1 - \zeta)\gamma)h$$

$$F(t) = f(z(t), T_{amb}(t) - 25) + g(T_{amb}(t), T_b(t)) + h(t)$$

$$\Delta T = T_{amb} - 25$$

$$f(z, \Delta T) = \tilde{f}(z) + (\Delta T)\theta_2 + \tilde{f}(z)(\Delta T)\theta_4 + \tilde{f}(z)(\Delta T)^2\theta_8 + (\Delta T)^3\theta_9$$

$$g(T_{amb}, T_b) = 7.12(T_b - T_{amb})$$

$$\zeta := \begin{cases} 1, & I \geq 0 \\ 0, & I < 0 \end{cases}$$

where $T_{amb}(t)$, $T_b(t)$ are the trajectories of ambient and cell temperatures respectively; Q is the capacity of the cell in Ampere hours (Ah) and I is the battery current in Amperes; and z is the state of charge (SOC).

Figure 11:
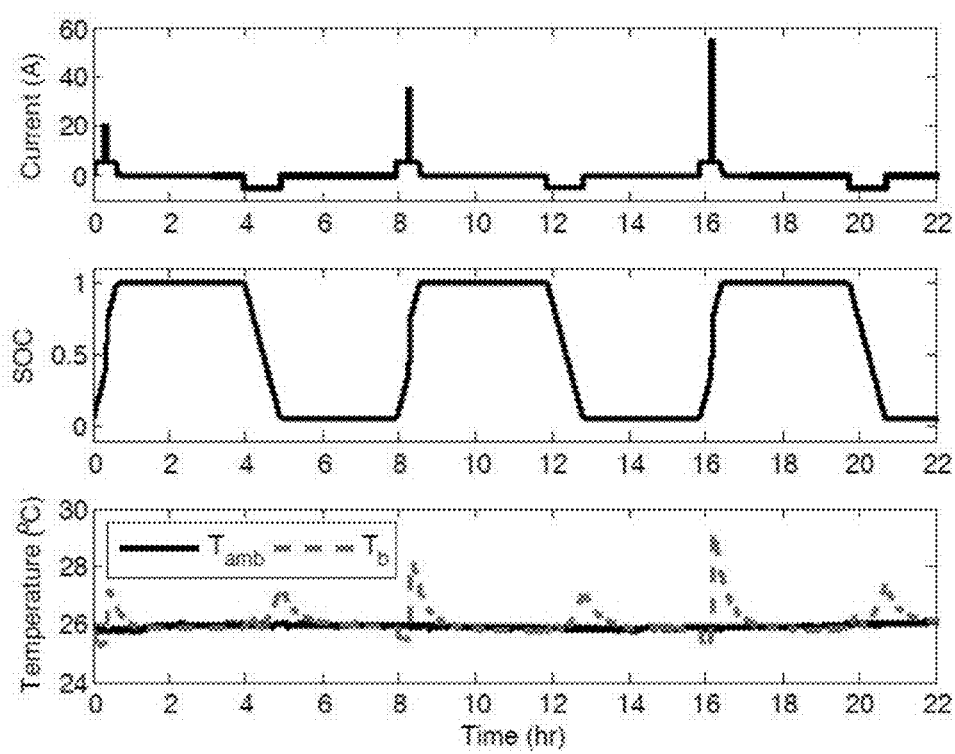
FIG. 11 is a set of data for model validation including current and corresponding changes in SOC and temperature of the battery.

To test the efficacy of the proposed model, the three-cell battery pack described above was tested using the designed charge and discharge duty cycle shown in FIG. 11. The current trajectory was designed such as to charge the cell at 1C rates in the SOC intervals [0, 0.35] and [0.75, 1]; within the SOC interval [0.37,0.75], the charging rate was chosen from the set {4C, 7C, 11C}. Once fully charged, after a rest of about three hours, the pack was completely discharged at 1C. This deliberate SOC dependence of current was adopted to minimize intercalation/film growth related stresses that have been observed at high and low states of charges at different current rates. In the middle range, a high C-rate current was chosen to effectively increase battery temperature due to internal heating, to put the temperature dependent terms in the model through its paces.

Figure 12:
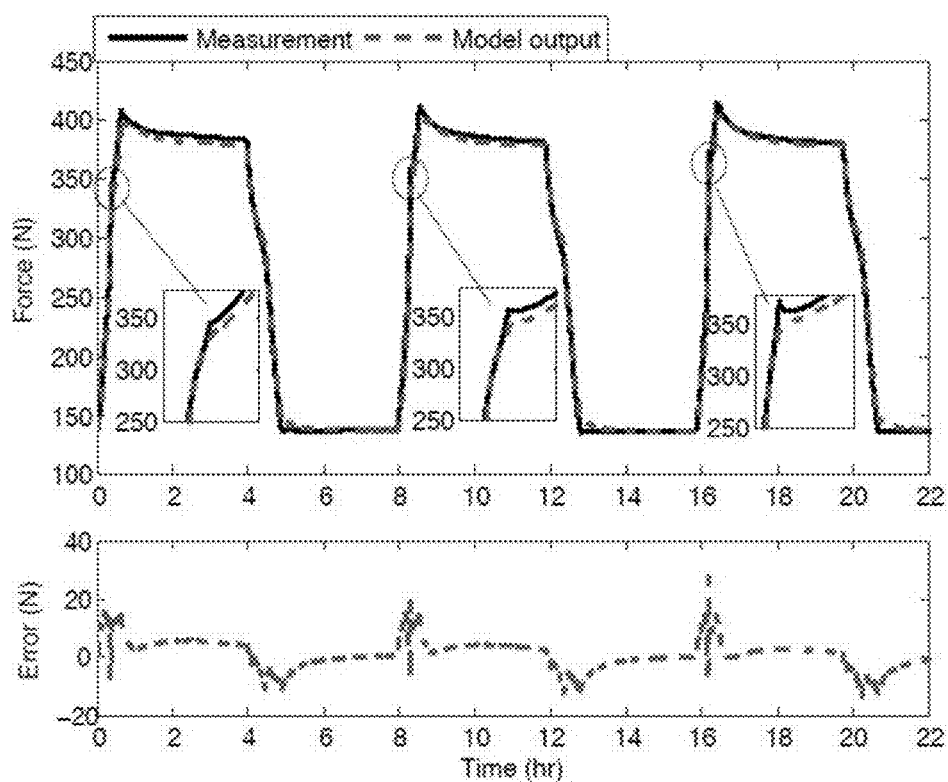
FIG. 12 is a graph of a comparison between measured and predicted force at conditions with periods of high c-rate and associated cell heating.

FIG. 12 presents results of simulating the model—measured per-bolt forces are compared against predicted forces. Quantitatively, there exist differences between the measured and predicted forces which amount to a root-mean-square error of 5.02 N over a range of 267 N. Much of the error in prediction is incident with phases of the trajectory during which the temperature of the cell is increased through internal heating; and that the instantaneous magnitude of error is positively correlated to the magnitude of current. Curiously though, the peak error occurs in the vicinity of the instant when the current magnitude reduces (at 75% SOC). We postulate that these peaks/spikes may be attributed to the influences of current magnitude and/or temperature distribution on bulk force. Under a high current rate operation, it is reasonable to expect non-homogeneity of thermal distribution across the battery; since the surface temperature of the battery is used to capture the impact of thermal transients to bulk force, high internal temperature may contribute to higher bulk force. Notably some of the peak errors could be significantly reduced if there is thermal gradient such that averaged temperature is 3° C. higher than surface temperature.

Improving SOC Estimation with Bulk Force Measurements

Accurate information on the state of charge (SOC) of Li-ion cells is really important to ensure power availability, prevent under/over-voltage related damage and potentially to monitor battery degradation. The SOC of a Li-ion cell is a measure of the remaining energy in the cell. While there are a variety of definitions and expressions, in practice, it is considered to be the ratio of residual energy to total capacity in the cell. Since SOC is not measurable, it is commonly estimated from the terminal voltage by a process that is called inversion; this is done using a model of the electrical dynamics.

Figure 13:
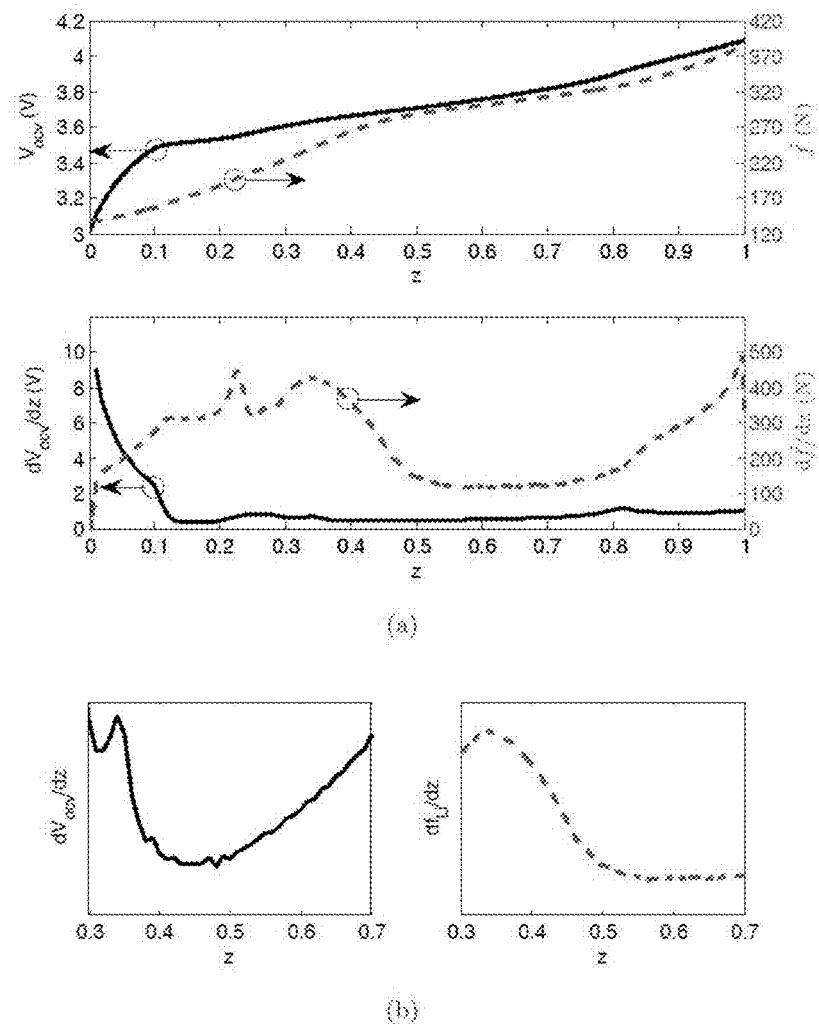
FIG. 13 is a graph of the comparison of the rate change of Open Circuit Voltage ($V_{OC}$) and intercalation related bulk force, f, with respect to State of Charge, z.

The most widely used representative of the electrical dynamics is based on an equivalent circuit model including an open circuit voltage $V_{OC}$ in series with a resistance $R_s$ and a R-C pair constituted by another resistance R and capacitance C. The representative dynamics of the equivalent circuit model used in HEVs is given by $$z_{k+1} = z_k + \alpha_z I_k$$

$$v_{k+1}^c = \alpha_v v_k^c + \beta_v I_k$$

$$V_k = V_{OC}(z_k) + I_k R_s + v_k^c \quad (8)$$

where $z_k$ denotes SOC, $v_k^c$ represents the bulk polarization, $V_{OC}(\cdot)$ is the nonlinear relation between open circuit voltage and SOC (refer FIG. 13(a)), Rs is the series resistance of the equivalent circuit model and V is the measured terminal voltage. Variables $\alpha_z$, $\alpha_v$ and $\beta_z$ are related to the parameters of the equivalent circuit model as follows $$\alpha_z = \frac{t_s}{3600 \cdot Q}$$

$$a_v = \exp\left(1 - \frac{t_s}{RC}\right)$$

$$\beta_v = R\left(1 - \exp\left(1 - \frac{t_s}{RC}\right)\right)$$

where $t_s$ is the duration of the sampling period assumed in discretizing the continuous time dynamics of the OCV-R-RC model; Q is the capacity of the cell in Ah, R, C are the parameters of the R-C pair.

Recent papers such as Refs. 23 and 24, concern themselves with architectures that invert the voltage dynamics. Unfortunately there are some SOC ranges that these dynamic equations are not always invertible, making SOC estimation hard, i.e., small perturbations to the measured voltage can result in large changes to the estimates. This is particularly pronounced during normal operation of Hybrid Electric Vehicles (HEVs) which operate over a constrained SOC window, typically [0.3,0.7]. In this section, we investigate the feasibility of using force measurements and the developed model to improve the estimation of SOC over this interval, where conventional measurements are inadequate.

We assert that it is feasible to use force measurements and that doing so can improve the accuracy of estimates of SOC. To show this, we suppose that measurements of terminal voltage, cell current, bulk force, ambient and cell temperatures are available over N+1 successive discrete samples. Then by considering two cases, each with a different collection of measured data, we show that there is a SOC interval of interest where using bulk force measurements can improve estimates of SOC. These two cases are specified based on the presence of force measurements. In the interest of simplifying the following arguments, in the remainder of this section, the influence of the hysteretic term is omitted, although a similar analysis is possible in their presence.

By stacking measurements of terminal voltage and bulk force, two vectors $Y_1$ and $Y_2$ are defined as $$Y_1 = [V_0, \ldots, V_N]', \quad Y_2 = [Y_1', [F_0, \ldots, F_N]]'$$

In a similar way, two vectors H1 and H2 are generated by propagating the models over the same interval, [0, ..., N], respectively.

$$H_1(z_0, v_0^c) = \begin{bmatrix} I_0 R_s + v_0^c + V_{oc}(z_0) \\ I_1 R_s + \alpha_v v_0^c + \beta_v I_0 + V_{oc}(z_0 + \alpha_z I_0) \\ \vdots \\ I_N R_s + \alpha_v^{N-1} v_0^c + \beta_v \sum_{i=1}^{N-1} \alpha_v^{i-1} I_i + V_{oc}\left(z_0 + \alpha_z \sum_{i=0}^{N-1} I_i\right) \end{bmatrix}$$

$$H_2(z_0, v_0^c) = \begin{bmatrix} H_1(z_0, v_0^c) \\ f(z_0) \\ f(z_0 + \alpha_z I_0) \\ \vdots \\ f\left(z_0 + \alpha_z \sum_{i=0}^{N-1} I_i\right) \end{bmatrix}$$

With the above setup, the SOC estimation problem for each case can be formulated as finding $(z_0, v_0^c)$ that minimizes the error between measurements and model outputs, $\|Y_j - H_j\|^2$, $j \in \{1,2\}$. This cost minimization problem can be solved using a nonlinear optimization technique called Newton's iteration [Ref. 25]. To update the estimate of the solution in this technique, it is necessary that the Jacobian matrix of $H_j$ with respect to $(x_0, v_0^c)$ must be of full rank during every iteration.

For simplicity of expressions, assume that the ambient temperature is 25° C. and set the value of N to one; the following expressions are obtained.

$$\left[\frac{\partial H_1}{\partial z} \frac{\partial H_1}{\partial v^c}\right]\bigg|_{(z_0, v_0^c)} = \begin{bmatrix} \frac{\partial V_{oc}(z)}{\partial z} & 1 \\ \frac{\partial V_{oc}(z + \alpha_z I_0)}{\partial z} & \alpha_v \end{bmatrix}\bigg|_{(z_0, v_0^c)}, \quad (9)$$

$$\left[\frac{\partial H_2}{\partial z} \frac{\partial H_2}{\partial v^c}\right]\bigg|_{(z_0, v_0^c)} = \begin{bmatrix} \frac{\partial V_{oc}(z)}{\partial z} & 1 \\ \frac{\partial V_{oc}(z + \alpha_z I_0)}{\partial z} & \alpha_v \\ \frac{\partial \tilde{f}(z)}{\partial z} & 0 \\ \frac{\partial \tilde{f}(z + \alpha_z I_0)}{\partial z} & 0 \end{bmatrix}\bigg|_{(z_0, v_0^c)} \quad (10)$$

Suppose the value of $\alpha_v \approx 1$ (as is usually the case, refer [Ref. 26]), if $$\frac{\partial V_{oc}(z + \alpha_z I_0)}{\partial z} \approx \frac{\partial V_{oc}}{\partial z},$$

then the Jacobian matrix of Equation (9) becomes ill-conditioned and the unique solution may not be robustly identified.

FIG. 13(b) presents the derivative of $V_{OC}$ and $\tilde{f}$ with respect to SOC over the typical operation of a HEV. The derivative of voltage and force were numerically computed by smoothing the measured data. Upon careful inspection, it is evident that between 40% and 50% SOC, $$\frac{\partial^2 V_{oc}(z)}{\partial z^2}$$

is almost zero suggesting that the inverse of Jacobian matrix of Equation (9) is unlikely to be robust: a small perturbation such as measurement noise of terminal voltage could lead to a large deviation of SOC estimate. Over the same interval however, the value of $$\frac{\partial^2 \tilde{f}(z)}{\partial z^2}$$

is non-zero suggesting that the condition number of the Jacobian matrix Equation (10) is potentially smaller than that of the Jacobian matrix Equation (9) and that estimated of $(z_0, v_0^c)$ may be more reliable.

Note that over the SOC interval [0.3,0.7], the second derivative of $\tilde{f}$ and $V_{OC}$ with respect to SOC complement each other—in the sense that they are both seldom zero together. This means that over this range of SOC, should robust unique solution using voltage measurements alone is unavailable, the inclusion of auxiliary force measurements may help to improve the estimates; this observation is more pronounced between 30% and 50% SOC.

A methodology has been described in U.S. Patent Application Publication No. 2013/0323554 [Ref. 27] to estimate the SOC and SOH of Li-ion cells. However, the model used in this and other literature is very simple and fails to account for the nonlinear relation between force/stress and SOC and temperature. To the inventors' best knowledge, the above section is the first discussion that provides a mathematical reason for why one might want to use force/stress measurements when estimating electrical model related states in Li-ion cells. In addition, we are able to quantitatively suggest the range of SOC over which force measurements may improve estimates (interval [0.3,0.5]).

In Example 1, a phenomenological model is developed to predict force in a battery pack. The proposed model is driven by ambient temperature, temperature of the battery, and state of charge. A one-state hysteresis model is included to capture observed behavior during change and discharge. The benefit of applying the proposed model to SOC estimation is investigated. It is found that bulk force model can improve the robustness of SOC estimation within the typical SOC range for HEVs. This framework can also be used to identify SOH of a battery because the irreversible swelling related to battery degradation leads to a gradual increase in measured bulk force.

EXAMPLE 2

In this Example, the electrical dynamics of the cell is represented by a two-state impedance model whose dynamics is shown in Equation (11). Equation (11) is obtained by discretizing the continuous-time dynamic equations using backward discretization method with sampling period of duration $T_s$ seconds. In the following, an underscript is used to denote the value of the variable at a particular sample.

$$z_{k+1} = z_k + \frac{T_s I_k}{Q} \tag{11}$$

-continued $$v_{k+1}^1 = \left(1 - \frac{T_s}{C_1(z_k)R_1(z_k)}\right)v_k^1 + \frac{I_k T_s}{C_1(z_k)}$$

$$v_{k+1}^2 = \left(1 - \frac{T_s}{C_2(z_k)R_2(z_k)}\right)v_k^2 + \frac{I_k T_s}{C_2(z_k)}$$

$$V_k = I_k R_s(z_k) + v_k^1 + v_k^2 + V_{oc}(z_k)$$

$$F_k = \tilde{f}(z_k)$$

where z is the SOC of the cell, Q is proportional to the capacity of the cell, $C_1(z)$, $C_2(z)$, $R_1(z)$, $R_2(z)$ are functionals that represent the dependence of the impedance model parameters on SOC. $V_{OC}(z)$ is the SOC dependent open circuit voltage of the cell; I is the current (charging current is positive); $v_1$, $v_2$ are polarization voltages; $R_S$ is ohmic resistance of the cell; terminal voltage is denoted by V; and $\tilde{f}(z)$ is a functional that represents the static relation between bulk force and SOC. For the purposes of this demonstrative study, the influence of temperature is not explicitly considered, i.e., the impedance model dynamics and the measured bulk force are not affected by the magnitude of current drawn from the battery.

In its present implementation, the electrical dynamics of the cell, as seen by the estimator is modeled by Equation (12). A few differences between the plant and model dynamics are immediately notable—the model has one less state than the plant and is uncertain due to additive disturbances to dynamics and measurements.

$$z_{k+1} = z_k + \frac{T_s I_k}{Q} + \vartheta_k^1 \tag{12}$$

$$v_{k+1}^1 = \left(1 - \frac{T_s}{C_1(z_k)R_1(z_k)}\right)v_k^1 + \frac{I_k T_s}{C_1(z_k)} + \vartheta_k^2$$

$$V_k = I_k R_s(z_k) + v_k^1 + V_{oc}(z_k) + \omega_k$$

$$F_k = \tilde{f}(z_k) + \upsilon_k$$

In this embodiment, the statistical properties of the various disturbances are given as follows $\forall j \in \{1,2\}$, $\vartheta_k^j \sim N(0,10^{-3})$; $\omega_k \sim N(0,5 \times 10^{-3})$. The variance of the noise associated with force measurements is intentionally taken to be a rather large number.

The Estimator

The observer under consideration for this implementation is the Extended Kalman Filter (EKF), a widely adopted method in practice; for convenience, the estimate update law is presented in Equation (13) for a generic nonlinear system whose dynamics is given by $$x_{k+1} = f(x_k, u_k)$$

$$y_k = g(x_k, u_k).$$

Note that in the update law, information on estimates of the noise covariance of the process and measurements, Q and R, is required.

$$\hat{x}_{k|k-1} = f(\hat{x}_{k-1|k-1}, u_{k-1}) \tag{13}$$

$$P_{k|k-1} = F_{k-1} P_{k-1|k-1} F_{k-1}^T + Q$$

$$e_k = y_k - h(\hat{x}_{k|k-1})$$

-continued $$S_k = H_k P_{k|k} H_k^T + R$$

$$K_k = P_{k|k-1} H^T S_k^{-1}$$

$$\hat{x}_{k|k} = \hat{x}_{k|k-1} + K_k e_k$$

$$P_{k|k} = (\mathbb{I} - K_k H_k) P_{k|k-1}$$

where $F_{k-1} = \dfrac{\partial f}{\partial x}\bigg|_{\hat{x}_{k-1|k-1}, u_{k-1}}$ and $H_k = \dfrac{\partial g}{\partial x}\bigg|_{\hat{x}_{k|k-1}}$ However, performance of the filter is influenced by the value of Q and R. Comparing the performance of the two estimators with different information sets necessitates that the value of Q and R be chosen to minimize estimation errors for each case. To counteract this, covariance matrices are chosen based on results of globally minimizing mean square error (MSE) using Genetic Algorithm (GA) for a specific current profile resulting from the US06 federal cycle.

Performance Comparison: Training Data

Figure 14:
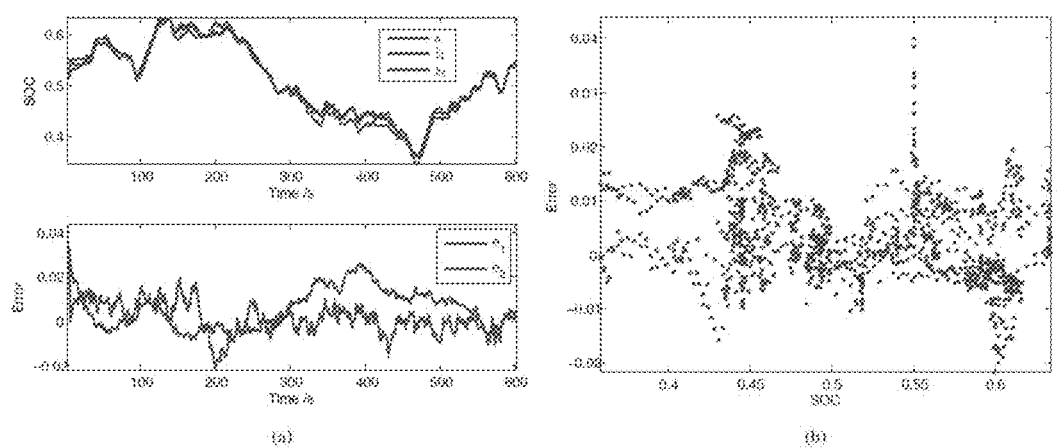
FIG. 14 is a graph of the comparison of SOC with and without force measurements, and a scatter plot of errors and their corresponding SOC.

The outcome of GA implementation is used as noise covariance. Estimates of SOC were derived using the updated law in Equation (13) and the instantaneous error in estimates of SOC of one iteration is presented in FIG. 14. While the initial condition of the plant dynamics was set to [0.55; 0; 0], that of the estimators was set to [0.5, 0]. In FIG. 14, the following notations are adopted—z is the actual SOC, $\hat{z}_1$ is the estimate of SOC obtained by measuring terminal voltage, and $\hat{z}_2$ is the estimate of SOC that is a result of measuring both terminal voltage and bulk force.

The trajectories of SOC, both measured and estimated, are traced in FIG. 14(a); upon inspecting the second subplot, it is noted that both estimators fare comparably when the root mean square (rms) of error is used as a metric for comparison. However, from FIG. 14(b), a figure that plots the error in estimates against the actual SOC at which that error occurs, it can be noted that at SOCs below 0.5, the estimator that incorporates bulk force measurements appears to perform better. This is consistent with analysis performed when studying feasibility in Example 1.

Figure 15:
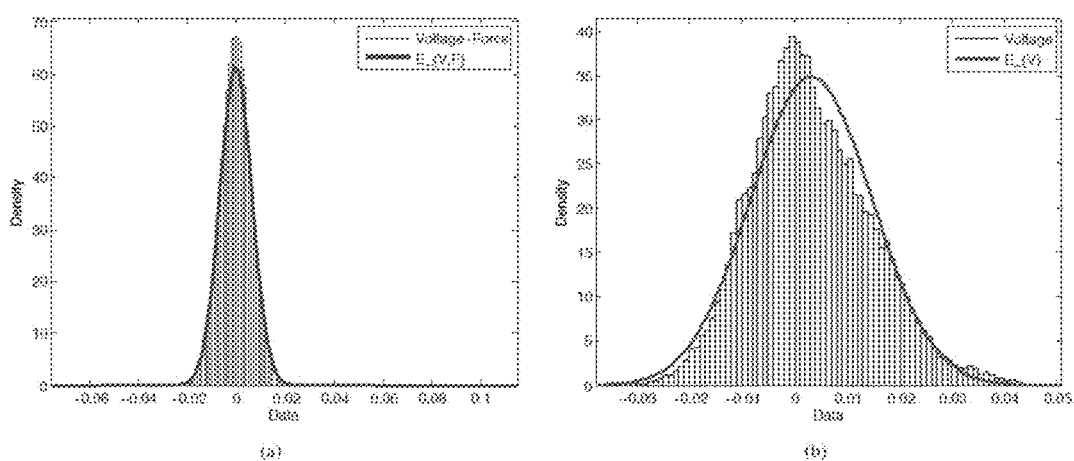
FIG. 15 is a graph of fitting instantaneous error over 100 iterations to a normal distribution with and without force measurements.

To compare, statistically, the performance of both estimators, the drive cycle was repeated 100 times and the instantaneous estimation errors of both estimators as fit to a normal distribution; results of the same are shown in FIG. 15. By comparing the means and variances of instantaneous errors, it is noted that estimator 1 (without force measurements $e_k \sim N(0.0032, 0.0001)$) performs notably worse than estimator 2 (with force measurements: $e_k \sim N(-0.0001, 0.0000)$)—the mean and variance from estimator 2 are an order smaller than from estimator 1.

REFERENCES

[1] Christensen, J. and Newman, J. *J. Solid State Electrochem.* 10(5), 293-319 (2006).
[2] Peabody, C. and Arnold, C. B. *J. Power Sources* 196(19), 8147-8153 October (2011).
[3] Christensen, J. *J. Electrochem. Soc.* 157(3), A366-A380 January (2010).
[4] Barai, P. and Mukherjee, P. P. *J. Electrochem. Soc.* 160(6), A955-A967 (2013).
[5] Song, Y., Lu, B., Ji, X., and Zhang, J. *J. Electrochem. Soc.* 159(12), A2060-A2068 (2012).
[6] Cheng, Y.-T. and Verbrugge, M. W. *J. Power Sources* 190(2), 453-460 (2009).
[7] Shi, D., Xiao, X., Huang, X., and Kia, H. *J. Power Sources* 196(19), 8129-8139 (2011).
[8] Fu, R., Xiao, M., and Choe, S.-Y. *Journal of Power Sources* 224(0), 211-224 (2013).
[9] Garrick, T. R., Kanneganti, K., Huang, X., and Weidner, J. W. *J. Electrochem. Soc.* 161(8), E3297-E3301 (2014).
[10] Xiao, X., Wu, W., and Huang, X. *J. Power Sources* 195(22), 7649-7660 November (2010).
[11] Siegel, J. B., Stefanopoulou, A. G., Hagans, P., Ding, Y., and Gorsich, D. *J. Electrochem. Soc.* 160(8), A1031-A1038 (2013).
[12] Zhang, N. and Tang, H. *J. Power Sources* 218(0), 52-55 (2012).
[13] Oh, K.-Y., Siegel, J. B., Secondo, L., Kim, S. U., Samad, N. A., Qin, J., Anderson, D., Garikipati, K., Knobloch, A., Epureanu, B. I., Monroe, C. W., and Stefanopoulou, A. *J. Power Sources* 267(0), 197-202 (2014).
[14] Qi, Y. and Harris, S. J. *J. Electrochem. Soc.* 157(6), A741-A747 January (2010).
[15] Winter, M., Wrodnigg, G. H., Besenhard, J. O., Biberacher, W., and Novk, P. *J. Electrochem. Soc.* 147(7), 2427-2431 (2000).
[16] Kim, Y., Mohan, S., Samad, N., Siegel, J. B., and Stefanopoulou, A. G. In *American Control Conference*, Portland, (2014).
[17] Kim, Y., Mohan, S., Siegel, J. B., and Stefanopoulou, A. G. In Proceedings of the *ASME 2013 Dynamic Systems and Control Conference*, number Paper No. DSCC2013-3935, (2013).
[18] Yazami, R. and Reynier, Y. *J. Power Sources* 153(2), 312-318 (2006).
[19] Woodford, W. H., Carter, W. C., and Chiang, Y.-M. *Energy Environ. Sci.* 5, 8014-8024 (2012).
[20] Sethuraman, V., Winkle, N. V., Abraham, D., Bower, A., and Guduru, P. *J. Power Sources* 206(0), 334-342 (2012).
[21] Plett, G. L. *J. Power Sources* 134(2), 277-292 (2004).
[22] Floudas, C. and Pardalos, P. *Encyclopedia of Optimization*. Number v. 1 in Encyclopedia of Optimization. Springer, (2008).
[23] Truchot, C., Dubarry, M., and Liaw, B. Y. *Applied Energy* 119(0), 218-227 (2014).
[24] Sepasi, S., Ghorbani, R., and Liaw, B. Y. *J. Power Sources* 245(0), 337-344 (2014).
[25] Moraal, P. and Grizzle, J. *Automatic Control, IEEE Transactions on* 40(3), 395-404 (1995).
[26] A. Samad, N., Stefanopoulou, A., and Siegel, J. In *DSCC*, (2014). Under review.
[27] Heubner, A., Has, R., Ruehle, A., and Henrici, F. U.S. Patent Application Publication No. 2013/0323554 A1 (2013).

The citation of any document is not to be construed as an admission that it is prior art with respect to the present invention.

Thus, the invention provides a phenomenological model of the bulk force exerted by a lithium ion cell during various charge, discharge, and temperature operating conditions. The measured and modeled force resembles the carbon expansion behavior associated with the phase changes during intercalation, as there are ranges of state of charge with a gradual force increase and ranges of SOC with very small change in force. The model includes the influence of temperature on the observed force capturing the underlying thermal expansion phenomena. Moreover, the model predicts accurately the changes in force during thermal transients, when internal battery heating due to high C-rates or rapid changes in the ambient temperature, which create a mismatch in the temperature of the cell and the holding fixture. It is shown that the bulk force model can be very useful for a more accurate and robust SOC estimation based on fusing information from voltage and force (or pressure) measurements.

Although the invention has been described in considerable detail with reference to certain embodiments, one skilled in the art will appreciate that the present invention can be practiced by other than the described embodiments, which have been presented for purposes of illustration and not of limitation. Therefore, the scope of the appended claims should not be limited to the description of the embodiments contained herein.

What is claimed is:

1. An electrical device comprising:
    a battery pack;
    a pressure sensor for measuring a volume change of the battery pack;
    a voltage sensor in electrical communication with a positive terminal and a negative terminal of the battery pack;
    a temperature sensor positioned in a cell of the battery pack; and
    a battery management system including a controller in electrical communication with the pressure sensor, the voltage sensor, and the temperature sensor, the controller being configured to execute a program stored in the controller to determine a state of charge percentage of the battery pack based on bulk force measurements from the pressure sensor, a terminal voltage reading from the voltage sensor, and a temperature reading from the temperature sensor.

2. The device of claim 1 further comprising:
    a current sensor wired to measure a current flowing from the pack,
    wherein the controller executes the program stored in the controller to determine the state of charge percentage of the battery pack based on the current flowing from the pack.

3. The device of claim 1 further comprising:
    a temperature sensor positioned to measure ambient temperature,
    wherein the controller executes the program stored in the controller to compensate for the ambient temperature to determine the state of charge percentage of the battery pack.

4. The device of claim 1 wherein:
    the controller executes the program stored in the controller to determine the state of charge percentage of the battery pack based on a charging current and a discharging current from the cell.

5. The device of claim 1 wherein:
    the controller executes the program stored in the controller to determine the state of charge percentage of the battery pack based on a charge/discharge hysteresis state of the cell.

6. The device of claim 1 wherein:
    the controller executes the program stored in the controller to determine the state of charge percentage of the battery pack based on a capacity of the cell.

7. The device of claim 1 wherein:
    the controller executes the program stored in the controller to compensate for the ambient temperature to determine the state of charge percentage of the battery pack.

8. The device of claim 1 wherein:
    the controller executes the program stored in the controller to compensate for a temperature in a cell of the battery pack to determine the state of charge percentage of the battery pack.

9. The device of claim 1 wherein:
    the controller executes the program stored in the controller to determine the state of charge percentage of the battery pack based on an internal resistance of a cell of the battery pack.

10. The device of claim 1 wherein:
    the controller executes the program stored in the controller to determine the state of charge percentage of the battery pack based on an open circuit voltage of a cell of the battery pack.

11. The device of claim 1 wherein:
    the controller chooses one program from a plurality of programs stored in the controller to determine the state of charge percentage of the battery pack.

12. The device of claim 11 wherein:
    one of the plurality of programs stored in the controller determines a state of charge percentage of the battery pack based on bulk force measurements of the battery pack, and
    another of the plurality of programs stored in the controller determines a state of charge percentage of the battery pack based on a terminal voltage reading from the voltage sensor.

13. The device of claim 1 wherein:
    the battery pack includes a plurality of cells.

14. The device of claim 1 wherein:
    the battery pack comprises a plurality of cells held in compression between a first plate and an opposed second plate.

15. The device of claim 14 wherein:
    the pressure sensor comprises a strain gauge adjacent an outer side of the first plate.

16. The device of claim 14 wherein:
    the pressure sensor comprises a load cell adjacent an outer side of the first plate.

17. The device of claim 1 wherein:
    the temperature sensor is positioned in contact with a cell of the battery pack.

18. An electrical device comprising:
    a battery pack;
    a temperature sensor positioned in a cell of the battery pack;
    a pressure sensor for measuring a volume change of the battery pack; and
    a battery management system including a controller in electrical communication with the temperature sensor, the controller being configured to execute a program stored in the controller to determine a state of charge percentage of the battery pack based on a temperature reading from the temperature sensor,
    wherein the controller executes the program stored in the controller to determine the state of charge percentage of the battery pack based on bulk force measurements from the pressure sensor.

19. The device of claim 18 further comprising:
    a current sensor wired to measure a current flowing from the pack, wherein the controller executes the program stored in the controller to determine the state of charge percentage of the battery pack based on the current flowing from the pack.

20. The device of claim 19 further comprising:
a temperature sensor positioned to measure ambient temperature,
wherein the controller executes the program stored in the controller to determine the state of charge percentage of the battery pack based on the ambient temperature.

21. The device of claim 19 wherein:
the program stored in the controller contains an algorithm to determine the state of charge percentage of the battery pack combining measurements of terminal voltage and force in proportion to a first and second derivative of their modeled relationship with the state of charge percentage.

22. The device of claim 18 wherein:
the controller executes the program stored in the controller to calculate a prediction of the battery volume change as a non-linear function of the state of charge, a temperature reading from the temperature sensor, and ambient temperature.

23. The device of claim 18 wherein:
the program stored in the controller contains a dynamic relationship between a volume change of each electrode of the battery pack and an overall battery volume change using a hysteretic model based on measured current of the battery pack.

24. The device of claim 18 wherein:
the temperature sensor is positioned in contact with a cell of the battery pack.

25. A method for determining the state of charge percentage of a battery pack, the method comprising:
measuring bulk force changes due to cycling in at least one cell of the battery pack to obtain bulk force measurements; and
calculating in a controller the state of charge percentage of the battery pack based on (i) the bulk force measurements, and at least one of (ii) a current of the battery pack, (iii) a temperature in at least one cell of the battery pack, (iv) a terminal voltage of a cell in the battery pack, (v) an estimate of at least one temperature in at least one cell of the battery pack, and (vi) a temperature of the ambient medium.

26. The method of claim 25 further comprising:
calculating in the controller the state of charge percentage of the battery pack based, at least in part, on a present estimate of the state of charge of the battery pack.

* * * * *

UNITED STATES PATENT AND TRADEMARK OFFICE
CERTIFICATE OF CORRECTION

PATENT NO. : 10,074,996 B2
APPLICATION NO. : 14/839096
DATED : September 11, 2018
INVENTOR(S) : Anna G. Stefanopoulou et al.

It is certified that error appears in the above-identified patent and that said Letters Patent is hereby corrected as shown below:

In the Specification

Column 1, Line 28, "lithium on cell" should be -- lithium ion cell --.

Column 1, Line 65, "lithium on batteries" should be -- lithium ion batteries --.

Signed and Sealed this
Sixteenth Day of October, 2018

Andrei Iancu
*Director of the United States Patent and Trademark Office*